United States Patent
Kidnie et al.

(10) Patent No.: US 6,855,474 B1
(45) Date of Patent: Feb. 15, 2005

(54) LASER THERMAL COLOR DONORS WITH IMPROVED AGING CHARACTERISTICS

(75) Inventors: Kevin M. Kidnie, St. Paul, MN (US); M. Zaki Ali, Mendota Heights, MN (US); Pao C. Vang, Brooklyn Park, MN (US)

(73) Assignee: Kodak Polychrome Graphics LLC, Norwalk, CT (US)

( * ) Notice: Subject to any disclaimer, the term of this patent is extended or adjusted under 35 U.S.C. 154(b) by 0 days.

(21) Appl. No.: 10/838,940

(22) Filed: May 3, 2004

(51) Int. Cl.[7] .............................. G03F 7/36; G03F 7/039
(52) U.S. Cl. .................... 430/200; 430/201; 430/270.1; 430/964; 428/32.86
(58) Field of Search ................................ 430/200, 201, 430/270.1, 964; 428/32.86

(56) References Cited

U.S. PATENT DOCUMENTS

| | | |
|---|---|---|
| 2,701,245 A | 2/1955 | Lynn |
| 4,190,321 A | 2/1980 | Dorer et al. |
| 4,252,843 A | 2/1981 | Dorer et al. |
| 4,340,276 A | 7/1982 | Maffitt et al. |
| 4,876,235 A | 10/1989 | DeBoer |
| 4,885,225 A | 12/1989 | Heller et al. |
| 4,950,639 A | 8/1990 | DeBoer et al. |
| 5,017,547 A | 5/1991 | DeBoer |
| 5,019,549 A | 5/1991 | Kellogg et al. |
| 5,126,760 A | 6/1992 | DeBoer |
| 5,156,938 A | 10/1992 | Foley et al. |
| 5,171,650 A | 12/1992 | Ellis et al. |
| 5,238,736 A | 8/1993 | Tseng et al. |
| 5,310,595 A | 5/1994 | Ali et al. |
| 5,380,644 A | 1/1995 | Yonkoski et al. |
| 5,395,729 A | 3/1995 | Reardon et al. |
| 5,401,606 A | 3/1995 | Reardon et al. |
| 5,475,418 A | 12/1995 | Patel et al. |
| 5,501,937 A | 3/1996 | Matsumoto et al. |
| 5,516,622 A | 5/1996 | Savini et al. |
| 5,518,861 A | 5/1996 | Coveleskie et al. |
| 5,580,693 A | 12/1996 | Nakajima et al. |
| 5,935,758 A | 8/1999 | Patel et al. |
| 2003/0104309 A1 * | 6/2003 | Koops et al. ............... 430/201 |

FOREIGN PATENT DOCUMENTS

| | | |
|---|---|---|
| EP | 0157568 | 10/1985 |
| EP | 0160395 | 11/1985 |
| EP | 0160936 | 11/1985 |
| EP | 0382420 | 8/1990 |
| EP | 0602893 | 6/1994 |
| EP | 0675003 | 10/1995 |
| GB | 2083726 | 3/1982 |
| JP | 63319191 | 12/1988 |
| JP | 63319192 | 12/1988 |
| JP | 5188016 | 7/1993 |
| WO | WO09012342 | 10/1990 |

OTHER PUBLICATIONS

*Applied Optics*, 9, 2260–2265 (1970).
U.S. Appl. No. 10/461,738 filed, Jun. 13, 2003, Kidnie et al.
U.S. Provisional application No. 60/506,475, Kidnie et al., filed Sep. 26, 2003.

* cited by examiner

*Primary Examiner*—Richard L. Schilling
(74) *Attorney, Agent, or Firm*—Faegre & Benson, LLP

(57) ABSTRACT

A donor element for proofing having at least a transfer material disposed on a substrate for the preparation of a digital halftone proof having consistent dot density characteristics over time. The donor element includes a transfer material having a donor binder, a cationic infrared absorbing dye, a thermally activated crosslinking agent and a dispersible material The donor element can also include a distinct, intermediate transfer layer disposed between the substrate and the transfer material. The donor element can be used in conjunction with a receptor element to provide a thermal imaging system.

59 Claims, No Drawings

//patents.google.com/patent/US6855474B1

LASER THERMAL COLOR DONORS WITH IMPROVED AGING CHARACTERISTICS

The present invention is directed generally to color proofing donor elements having increased shelf life as well as the methods of making and using the color proofing donor elements. More specifically, the present invention involves the inclusion of a thermally activated crosslinking agent capable of improving the stability of a cationic infrared absorbing dye.

BACKGROUND

There is an important commercial need to obtain a color proof that will accurately represent at least the details and color tone scale of the image before a printing press run is made. In many cases, it is also desirable that the color proof accurately represents the image quality and halftone pattern of the prints obtained on the printing press. In the sequence of operations necessary to produce an ink-printed, full-color picture, a proof is also required to check the accuracy of the color separation data from which the final three or more printing plates or cylinders are made.

In general, the image in a color proof is formed by transferring a colorant (e.g. a dye, pigment, metallic or white and opaque spot colorant) from a donor element to a receptor element under the influence of energy from an energy source such as a thermal printhead or a laser. This transfer can occur via mass transfer or dye transfer.

In a mass transfer system, the majority of the material on the donor element (e.g., colorant, binder, and additives) is transferred to the receptor element. Typically, this can occur either by a melt mechanism or by an ablation mechanism. In a melt mechanism, the donor material is softened or melted. This softened or molten material then flows across to the receptor. This is typically the mechanism at work in a thermally induced wax transfer system. In an ablation mechanism, gases are typically generated that explosively propel the donor material across to the receptor. This results from at least partially volatilizing the binder or other additives in and/or under a layer of the donor material to generate propulsive forces to propel the colorant toward the receptor.

The image in a color proof formed from a mass transfer system is typically a half tone image. In a system that forms half tone images, the transfer gives a bi-level image in which either zero or a predetermined density level is transferred in the form of discrete dots (i.e., pixels). These dots can be randomly or regularly spaced per unit area, but are normally too small to be resolved by the naked eye. Thus, the perceived optical density in a half tone image is controlled by the size and the number of discrete dots per unit area. The smaller the fraction of a unit area covered by the dots, the less dense the image will appear to an observer.

In a dye transfer system, only the colorant is transferred from the donor to the receptor. Thus, the colorant is transferred without binder or other additives. This can occur either by a diffusion mechanism or a sublimation mechanism.

The image in a color proof formed from a dye transfer system is typically a continuous tone (i.e., contone) image. In a continuous tone or contone image, the perceived optical density is a function of the quantity of colorant per pixel, higher densities being obtained by transferring greater amounts of colorant. To emulate half tone images using a thermal dye transfer system, a laser beam can be modulated by electronic signals which are representative of the shape and color of the original image to heat and ultimately volatilize dye only in those areas where the dye is required on the receptor element to reconstruct the color of the original object. Further details of this process are disclosed in GB Publication No. 2,083,726 (3M). U.S. Pat. No. 4,876,235 (DeBoer) and U.S. Pat. No. 5,017,547 (De Boer) also disclose a thermal dye transfer system in which the perceived optical density is obtained by controlling the tonal gradation or thickness (density) of the colorant per pixel. In this system, the receptor element also includes spacer beads to prevent contact between the donor element and receptor element. This allows for the dye to diffuse or sublime across to the receptor element without the binder.

The shape and/or definition of the dots can effect the quality of the image. For example, dots with more well defined and sharper edges will provide images with more reproducible and accurate colors. The shape and/or definition of the dots are typically controlled by the mechanism of transfer of the image from the donor element to the receptor element. For example, as a result of the propulsive forces in an ablation system, there is a tendency for the colorant to "scatter" and produce less well defined dots made of many fragments. Attempts have been made to produce more well defined dots using an ablation system, such as those described in U.S. Pat. No. 5,156,938 (Foley) and U.S. Pat. No. 5,171,650 (Ellis), but such systems do not produce contract-quality images.

In contrast to ablation systems, melt systems can in principle form more well-defined dots and sharper edges to achieve more reproducible and accurate colors. Such systems, however, are not free of disadvantages. Many of the known laser-induced melt transfer systems employ one or more waxes as binder materials. The use of a wax results in a transfer layer that melts sharply to a highly fluid state at moderately elevated temperatures thus resulting in higher sensitivity. At the same time, however, melt systems are prone to image spread as a result of wicking or uncontrolled flow of the molten transfer material. Furthermore, because the laser absorber is normally transferred along with the desired colorant, the final image may lack the accuracy of color rendition required for high quality proofing purposes. Attempts have also been made to increase the sensitivity of the proofing systems by adding plasticizers (U.S. Pat. No. 5,401,606 (Reardon)), which lowers the melt viscosity and increases the flow, however, the plasticizers soften the films such that they become receptive to impressions and blocking.

The ability to image using a laser imaging source introduces significant advantages. For imaging by means of laser-induced transfer, the donor element typically includes a support bearing, in one or more coated layers, an absorber for the laser radiation, a transferable colorant, and one or more binder materials. When the donor element is placed in contact with a suitable receptor and subjected to a pattern of laser irradiation, absorption of the laser radiation causes rapid build-up of heat within the donor element, sufficient to cause transfer of colorant to the receptor in irradiated areas. By repeating the transfer process using different donor elements and the same receptor, it is possible to superimpose several monochrome images on a common receptor, thereby generating a full color image. This process is ideally suited to the output of digitally stored image information. It has the additional benefits of not requiring chemical processing and of not employing materials that are sensitive to normal white light.

As discussed above, laser-induced transfer can involve either mass transfer of the binder, colorant and infrared absorber, giving a bi-level image in which either zero or maximum density is transferred (depending on whether the applied energy exceeds a given threshold), or dye sublimation transfer, giving a continuous tone image (in which the density of the transferred image varies over a significant range with the energy absorbed). Laser-induced mass transfer has been characterized in the literature, in Applied Optics, 9, 2260–2265 (1970), for example, as occurring via two different modes. One mode involves a less energetic mode in which transfer occurs in a fluid state (i.e., by melt transfer), and one mode involves a more energetic mode in which transfer occurs by an explosive force, as a result of generation and rapid expansion of gases at the substrate-coating interface (i.e., by ablation transfer). This distinction has also been recognized in U.S. Pat. No. 5,156,938 (Foley), U.S. Pat. No. 5,171,650 (Ellis), U.S. Pat. No. 5,516,622 (Savini), and U.S. Pat. No. 5,518,861 (Covalaskie), which refer to ablation transfer as a process distinct from melt transfer, and refer to its explosive nature, as opposed to U.S. Pat. No. 5,501,937 (Matsumoto), U.S. Pat. No. 5,401,606 (Reardon), U.S. Pat. No. 5,019,549 (Kellogg), and U.S. Pat. No. 5,580,693 (Nakajima), which refer to transfer of a colorant in a molten or semi-molten (softened) state, with no mention of explosive mechanisms.

Thermal transfer systems have been developed that overcome the disadvantages previously described for the dye transfer systems and mass transfer systems. These systems utilize a mechanism referred to as laser-induced film transfer (LIFT) and multi-LIFT, which is utilized when there is more than one layer of transfer material. Such systems have been reported in U.S. Pat. No. 5,935,758 (Patel et al.) and U.S. patent application Ser. No. 10/461,738 (Kidnie et al.). The LIFT system includes components such as crosslinking agents and bleaching agents to further promote a more controllable dot size and more reproducible and accurate colors. The crosslinking agent reacts with the donor binder upon exposure to infrared laser radiation to form a high molecular weight network. The net effect of this crosslinking is better control of the melt flow phenomena, transfer of more cohesive material to the receptor and higher quality dots. Although other systems involve crosslinking a colorant layer subsequent to transfer to the receptor to prevent back transfer during transfer of the next colorant layer, as in U.S. Pat. No. 5,395,729 (Reardon) and EP 160 395 (ICI) and 160 396 (ICI), the ability to effect crosslinking as a direct result of laser transfer, and hence produce a durable transferred image that is not prone to back transfer represents an improvement over Reardon and ICI.

Using the LIFT or multi-LIFT systems, a half tone image can be formed by the transfer of discrete dots of a film of binder, colorant and additives from the donor element to a receptor element. The dots are formed from a molten or softened film and have well-defined, generally continuous edges that are relatively sharp with respect to density or edge definition; in other words, the dots are formed with relatively uniform thickness over their area. This is in contrast to the dye transfer and mass transfer methods previously described. Dye transfer methods involve transfer of the colorant without the binder and mass transfer methods such as ablation propel fractions of the transfer material but at least partially decomposing the binder. Neither of these methods produces well defined dots with relatively uniform thickness.

Although the LIFT and multi-LIFT systems produce dots having well-defined, generally continuous edges that are relatively sharp with respect to density or edge definition, it has been observed that the thermal absorbing material, such as the cationic infrared absorbing dye, exhibits reduced absorbance as it ages. Because the LIFT and multi-LIFT systems utilize laser energy to effect the transfer of material, the reduced absorbance of the thermal absorbing material has a detrimental impact on overall dot quality. Therefore, there is a need for a thermal transfer system that can produce dots having well-defined, generally continuous edges that are relatively sharp with respect to density or edge definition with greater stability of the thermal absorbing material.

SUMMARY OF THE INVENTION

The present invention provides, generally, a donor element for color proofing. One embodiment of the present invention is a donor element having a donor substrate and a transfer material, where the transfer material invention includes a donor binder, a cationic infrared absorbing dye, a dispersible material and a thermally activated crosslinking agent of the formula (Ia):

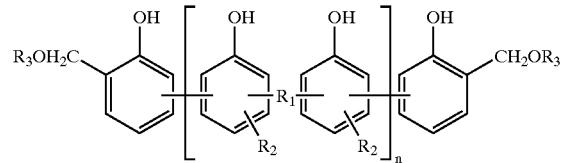

wherein n is 1–50; $R_1$ is $CH_2$ or $CH_2OCH_2$ at either the ortho- or para-position; $R_2$ is alkyl at the meta-position when $R_1$ is para or at the para-position when $R_1$ is ortho-; $R_3$ can be independently hydrogen or butyl.

The transfer material can further include a fluorocarbon additive and optional additives such as coating aids, dispersing agents, optical brighteners, UV absorbers, fillers, surfactants, plasticizers and combinations thereof provided the optional additive does not interfere with the functional characteristics of the transfer material.

In one embodiment of the present invention, the transfer material is provided as a single layer, which is also referred to as a transfer layer for the purposes of this disclosure.

In another embodiment of the present invention is provided a multi-layer construction donor element. The donor element of this embodiment can include a donor substrate and transfer material in the form of at least two layers. In this embodiment is provided an intermediate transfer layer having an intermediate transfer layer donor binder and a cationic infrared absorbing dye disposed on one side of the donor substrate. An intermediate transfer layer crosslinking agent that reacts upon exposure to heat treatment can also be added to the intermediate transfer layer. In this embodiment is further provided the transfer layer previously described for the single layer donor element in the form of a distinct layer disposed on the intermediate transfer layer. Thus, in one embodiment of the present invention, this transfer layer includes the donor binder, cationic infrared absorbing dye, dispersible material and the thermally activated crosslinking agent previously described for the transfer material of the single layer donor element. This transfer layer can further include the optional additives previously described for the transfer material of the single layer donor element provided these components do not interfere with the functional characteristics of the transfer layer. In a particular embodiment of the present invention, the dispersible material of the transfer layer includes metallic flakes.

In yet another embodiment of the present invention is provided a thermal imaging system that includes one of the donor elements previously described as well as a receptor element. In one embodiment of the present invention, the receptor element can include a receptor binder, a bleaching agent and particulate material. Thus, in one embodiment of the present invention, the thermal imaging system can include a donor element having a donor substrate and transfer material where the transfer material includes a donor binder, a cationic infrared absorbing dye, dispersible material and a thermally activated crosslinking agent of formula (Ia).

Alternatively, the thermal imaging system can include a multi-layer construction donor element having donor substrate and transfer material in the form of a multi-layer construction donor element having at least two layers. In this embodiment is included an intermediate transfer layer having an intermediate layer donor binder and a cationic infrared absorbing dye disposed on one side of the donor substrate. An intermediate layer crosslinking agent that reacts upon exposure to heat treatment can also be added to the intermediate transfer layer. In this embodiment is further provided the transfer material previously described for a single layer donor element in the form of a distinct layer disposed on the intermediate transfer layer. In one embodiment of the present invention, this layer of transfer material includes the donor binder, cationic infrared absorbing dye, dispersible material and the thermally activated crosslinking agent previously described for the transfer material of the single layer donor element. This layer of transfer material can further include the optional additives previously described for the transfer material of the single layer donor element provided these components do not interfere with the functional characteristics of the transfer material.

In still another embodiment of the present invention is provided a method of making a donor element. This embodiment can include the steps of dissolving the transfer material components previously described in a suitable solvent to form a donor solution, coating the donor solution on a donor substrate and drying the coated donor solution. Where the donor element includes a multi-layer construction donor element, the steps include dissolving the components of the intermediate transfer layer in a suitable solvent to form an intermediate transfer layer donor solution, coating the intermediate transfer layer donor solution on a donor substrate and drying the coated intermediate transfer layer donor solution first. The steps can further include dissolving the components of the distinct transfer layer previously described in a suitable solvent to form a donor solution, coating the donor solution on the dry intermediate transfer layer and drying the coated donor solution.

Another embodiment of the present invention is a method of imaging that includes the donor elements previously described. One embodiment includes the step of assembling one of the previously described donor elements in contact with a receptor element such as the receptor element previously described to form an assembly. This embodiment further includes the step of exposing the assembly to laser radiation of a wavelength absorbed by the cationic infrared absorbing dye such that exposed portions of the donor element are transferred to the receptor element. In this embodiment the laser radiation can be modulated in accordance with digitally stored information. Further included is the step of separating the donor element and receptor element to reveal an image residing on the receptor element. It is possible in an embodiment of present method to repeat this imaging cycle using a different donor element having a different dispersible material for each cycle but the same receptor element. It is also possible in an embodiment of the present method to subject the receptor element and image residing on the receptor element to heat treatment as well as transfer the image residing on the receptor element to another receptor as a final step.

DETAILED DESCRIPTION

The present invention involves a donor element for use in color proofing as well as a thermal imaging system and a method of making and using a thermal imaging system using the donor element, in which the thermal absorbing agent is stabilized for improved absorption over time. More specifically, the present invention involves the mass transfer of a dispersible material such as a colorant and/or metallic flakes of a half-tone image from a donor element (also referred to herein as "donor") to a receptor element (also referred to herein as "receptor") under the influence of energy, such energy supplied by a laser.

Donor elements for laser-induced thermal imaging for color proofing are known. Examples of such donor elements are reported in U.S. Pat. No. 5,935,758 (Patel et al.) and U.S. patent application Ser. No. 10/461,738 (Kidnie et al.), which are both incorporated herein by reference in their entirety. In contrast to these known donor elements, however, the donor element of the present invention includes a thermally activated crosslinking agent of formula (Ia):

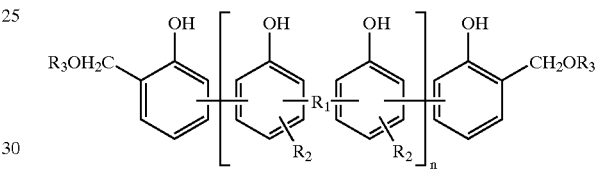

wherein n is 1–50; $R_1$ is $CH_2$ or $CH_2OCH_2$ at either the ortho- or para-position; $R_2$ is alkyl at the meta-position when $R_1$ is para or at the para-position when $R_1$ is ortho-; $R_3$ can be independently hydrogen or butyl.

It has been surprisingly discovered that inclusion of this thermally activated crosslinking agent results in a donor element having increased shelf life while still retaining the performance characteristics of known donor elements such as those reported in U.S. Pat. No. 5,935,758 (Patel et al.) and U.S. patent application Ser. No. 10/461,738 (Kidnie et al.).

The thermally activated crosslinking agent of the present invention at least increases stabilization of the cationic infrared absorbing dye to prevent loss of absorbing capability. This results in increased effectiveness of the cationic infrared absorbing dye over time. Compared to donor elements that do not contain the thermally activated crosslinking agent of the present invention, there is a dramatic improvement in the consistency of the density of the transferred material as measured by the reflection optical density (ROD) and dot gain after aging of the donor element.

Donor Element

The donor element (donor) of the present invention typically includes a substrate coated on one side with one or more layers of a transfer material. In one embodiment of the present invention the transfer material is provided as a single layer. This layer will be referred to as a transfer layer. In another embodiment of the present invention, the transfer material is in the form of a multi-layer construction donor element having at least two layers. In an embodiment involving a multi-layer construction donor element, there can be an intermediate transfer layer and the transfer layer of the single layer donor element.

In all embodiments, the donor element includes a layer of transfer material (the transfer layer) that includes a donor binder, a cationic infrared absorbing dye, a dispersible material and the thermally activated crosslinking agent of formula (Ia). Each of these components is described in greater detail below.

The transfer layer can also include a fluorocarbon additive and optional additives, which are also described in greater detail below.

In an alternative embodiment of the present invention, the transfer layer can further include a crosslinking agent of formula (II):

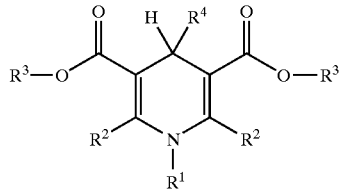

wherein: $R^1$ is hydrogen or an organic group, and each of $R^2$ and $R^3$ is an organic group, and $R^4$ is aryl. Each of $R^1$, $R^2$, and $R^3$ can be a polymeric group. This crosslinking agent is reported in reported in U.S. patent application Ser. No. 10/461,738 (Kidnie et al.).

Where the donor element has a single layer, the transfer layer is disposed directly on a donor substrate.

Alternatively, the donor can include transfer material that is in the form of a multi-layer construction having at least two layers. In this embodiment is provided an intermediate transfer layer disposed on the donor substrate and the transfer layer of the single layer donor element disposed on the intermediate transfer layer. The transfer layer is provided as a layer distinct from the intermediate transfer layer. Additionally, the transfer layer and the intermediate transfer layer remain independent and do not mix to a great extent.

The intermediate transfer layer can include an intermediate transfer layer binder and a cationic infrared absorbing agent, both of which are described in greater detail below. The intermediate transfer layer can also include an intermediate layer crosslinking agent and an intermediate layer crosslinking catalyst that react upon drying and heating of the intermediate transfer layer coating. Additionally, the intermediate transfer layer can include optional components such as those provided for the transfer layer.

As previously described for a single layer donor element, the transfer layer of the multi-layer construction includes the donor binder, cationic infrared absorbing dye, dispersible material and thermally activated crosslinking agent of formula (Ia). In a particular embodiment of the present invention the dispersible material includes metallic flakes. The transfer layer can also include the fluorocarbon additive and optional additives, which are also described in greater detail below.

In contrast to the intermediate layer crosslinking agent, the thermally activated crosslinking agent of the transfer layer reacts upon exposure to laser thermal energy.

Substrate

Suitable substrates for the donor include, for example, plastic sheets and films such as polyethylene terephthalate, fluorene polyester polymers, polyethylene, polypropylene, acrylics, polyvinyl chloride and copolymers thereof, and hydrolyzed and non-hydrolyzed cellulose acetate. The substrate needs to be sufficiently transparent to imaging radiation such as that emitted by a laser or laser diode to effect thermal transfer of the corresponding image to a receptor sheet. In one embodiment of the present invention the substrate for the donor is a polyethylene terephthalate sheet. Typically, the polyethylene terephthalate sheet is from about 20 to 200 μm thick. If necessary, the substrate may be surface-treated so as to modify its wetability and adhesion to subsequently applied coatings. Such surface treatments include corona discharge treatment and the application of subbing layers or release layers. A suitable release layer can include polyvinyl alcohol.

The surface of the donor element exposed to laser radiation may include a microstructure surface to reduce the formation of optical interference patterns, although significantly this has not been a problem with the system of the present invention. The microstructure surface may be composed of a plurality of randomly positioned discrete protuberances of varying heights and shapes. Microstructure surfaces may be prepared by the methods described in U.S. Pat. No. 4,340,276 (Maffitt), U.S. Pat. No. 4,190,321 (Dorer), and U.S. Pat. No. 4,252,843 (Dorer), each of which is incorporated by reference.

Donor Binder

Intermediate Transfer Layer Donor Binder

The intermediate transfer layer donor binder can include a binder that is a hydroxylic polymer (a polymer having a plurality of hydroxy groups). In one embodiment of the present invention, 100% of the intermediate layer binder is a hydroxylic polymer. Prior to exposure to laser radiation, the intermediate donor layer should be in the form of a smooth, tack-free coating, with sufficient cohesive strength and durability to resist damage by abrasion, peeling, flaking, dusting, etc., in the course of normal handling and storage. If the hydroxylic polymer is the sole or major component of the intermediate layer binder, then its physical and chemical properties should be compatible with the above requirements. Thus, film-forming polymers with glass transition temperatures higher than ambient temperatures are preferred. The hydroxylic polymers should be capable of dissolving or dispersing the other components of the intermediate transfer layer transfer material and should themselves be soluble in the typical coating solvents such as lower alcohols, ketones, ethers, hydrocarbons, haloalkanes or mixtures thereof.

The hydroxy groups may be alcoholic groups, phenolic groups or mixtures thereof. In one embodiment of the present invention the hydroxy groups are alcoholic groups. The requisite hydroxy groups may be incorporated by polymerization or copolymerization of hydroxy-functional monomers such as alkyl alcohol and hydroxyalkyl acrylates or methacrylates, or by chemical conversion of preformed polymers, such as by hydrolysis of polymers and copolymers of vinyl esters such as vinyl acetate. Polymers with a high degree of hydroxy functionality (also referred to as hydroxy functional polymers), such as poly(vinyl alcohol) and cellulose are suitable for use in the invention. Derivatives of these hydroxy functional polymers generally exhibit superior solubility and film-forming properties, and provided that at least a minor proportion of the hydroxy groups remain unreacted, they are also suitable for use in the invention. In one embodiment of the present invention the hydroxylic polymer for use in the invention belongs is a derivative of a hydroxy functional polymer and is the product formed by reacting poly(vinyl alcohol) with butyraldehyde; namely polyvinyl butyral. Commercial grades of polyvinyl butyral typically have at least 5% of the hydroxy groups unreacted (free) and are soluble in common organic solvents and have excellent film-forming and pigment-dispersing properties. One suitable polyvinyl butyral binder is available under the trade designation BUTVAR B-72 from Solutia, Inc., St. Louis, Mo. This binder includes from about 17.5 to 20% free hydroxyl groups, has a Tg of from about 72° C. to 78° C. and a flow temperature at 1000 psi of from about 145° C. to 155° C.

Although such polyvinyl butyral binders are not typically used in crosslinking reactions, in an alternative embodiment of the present invention the BUTVAR B-72 polyvinyl butyral is crosslinked. This is accomplished by adding an intermediate layer crosslinking agent such as the Desmodur aromatic polyisocyanate crosslinker available under the trade designation DESMODUR CB55N and an intermediate layer crosslinking catalyst such as dibutyltin dilaureate into the intermediate transfer layer. The crosslinking reaction is maximized upon drying and/or baking of the coated intermediate transfer layer.

In another embodiment of the present invention, a blend of one or more noncrosslinkable polymers may be used. The noncrosslinkable polymer typically provides the requisite film-forming properties, which may enable the use of lower molecular weight polyols. Such polymers should be nonreactive when exposed to laser radiation during imaging of the present invention. Suitable such polymers include, for example, polyesters, polyamides, polycarbamates, polyolefins, polystyrenes, polyethers, polyvinyl ethers, polyvinyl esters, polyacrylates, and polymethacrylates. Some examples of suitable noncrosslinkable polymers include, for example, polymethyl methacrylate, such as that available under the trade designation ELVACITE from DuPont, Wilmington, Del. Polymers that decompose when exposed to laser radiation during imaging are less desirable, although not entirely unusable. For example, polymers and copolymers of vinyl chloride are less desirable because they can decompose to release chlorine, which leads to discoloration and problems with accurate color match.

In one embodiment of the present invention, the intermediate transfer layer donor binder is present in an amount of from about 50 wt-% to about 95 wt-% based on the total weight of the intermediate transfer layer. In an alternative embodiment of the present invention, the intermediate transfer layer donor binder is present in an amount of from about 70 wt-% to about 90 wt-% based on the total weight of the intermediate transfer layer.

Donor Binder

In one embodiment of the present invention, the transfer layer binder includes a crosslinkable binder, which is a hydroxylic polymer. In one embodiment of the present invention, 100% of the binder is a hydroxylic polymer. The transfer layer should be in the form of a smooth, tack-free coating, with sufficient cohesive strength and durability to resist damage by abrasion, peeling, flaking, dusting, etc., in the course of normal handling and storage. If the hydroxylic polymer is the sole or major component of the donor binder, then its physical and chemical properties should be compatible with the above requirements. Thus, film-forming hydroxylic polymers with glass transition temperatures higher than ambient temperatures are preferred. The hydroxylic polymers should be capable of dissolving or dispersing the other components of the transfer material of the transfer layer, and should themselves be soluble in the typical coating solvents such as lower alcohols, ketones, ethers, hydrocarbons, or haloalkanes.

The hydroxy groups may be alcoholic groups, phenolic groups or mixtures thereof. In one embodiment of the present invention the hydroxy groups are alcoholic groups.

The requisite hydroxy groups may be incorporated by polymerization or copolymerization of hydroxy-functional monomers such as alkyl alcohol and hydroxyalkyl acrylates or methacrylates, or by chemical conversion of preformed polymers, such as by hydrolysis of polymers and copolymers of vinyl esters such as vinyl acetate. Polymers with a high degree of hydroxy functionality (also referred to as hydroxy functional polymers), such as poly(vinyl alcohol) and cellulose are suitable for use in the invention. Derivatives of these hydroxy functional polymers generally exhibit superior solubility and film-forming properties, and provided that at least a minor proportion of the hydroxy groups remain unreacted, they are also suitable for use in the invention. In one embodiment of the present invention the hydroxylic polymer for use in the invention belongs is a derivative of a hydroxy functional polymer and is the product formed by reacting poly(vinyl alcohol) with butyraldehyde; namely polyvinyl butyral. Commercial grades of polyvinyl butyral typically have at least 5% of the hydroxy groups unreacted (free) and are soluble in common organic solvents and have excellent film-forming and pigment-dispersing properties. One suitable polyvinyl butyral binder is available under the trade designation BUTVAR B-76 from Solutia, Inc., St. Louis, Mo. This binder includes from about 11 to 13% free hydroxyl groups, has a Tg of from about 62° C. to 72° C. and a flow temperature at 1000 psi of from about 110° C. to 115° C. Other hydroxylic binders from the BUTVAR series of polymers may be used in place of the BUTVAR B-76. These include, for example, other polyvinyl butyral binders available under the trade designations BUTVAR B-79 from Solutia, Inc. Still others are MOWITAL B30T from Hoechst Celanese, Chatham, N.J. The various products typically vary with respect to the amount of free hydroxyl groups. For example BUTVAR B-76 polyvinyl butyral includes less than about 13-mole % free hydroxy groups, whereas MOWITAL B30T polyvinyl butyral includes about 30% free hydroxy groups. Although such polyvinyl butyral binders are not typically used in crosslinking reactions, in the system of the present invention it is believed that the BUTVAR B-76 polyvinyl butyral crosslinks with the thermally activated crosslinking agent described below.

Alternatively, a blend of one or more noncrosslinkable polymers with one or more crosslinkable hydroxylic polymers may be used. The noncrosslinkable polymer typically provides the requisite film-forming properties, which may enable the use of lower molecular weight polyols. Such polymers should be nonreactive when exposed to the laser radiation used during imaging of the present invention. Suitable such polymers include, for example, polyesters, polyamides, polycarbamates, polyolefins, polystyrenes, polyethers, polyvinyl ethers, polyvinyl esters, polyacrylates, and polymethacrylates. Suitable noncrosslinkable polymers that can be combined with the crosslinkable hydroxylic polymer described above in the transfer material of the transfer layer include, for example, polymethyl methacrylate, such as that available under the trade designation ELVACITE from DuPont, Wilmington, Del. Whether crosslinkable or noncrosslinkable, polymers that decompose upon exposure to laser radiation during imaging are less desirable, although not entirely unusable. For example, polymers and copolymers of vinyl chloride are less desirable because they can decompose to release chlorine, which leads to discoloration and problems with accurate color match.

In one embodiment of the present invention, the intermediate transfer layer donor binder is present in an amount of from about 20 wt-% to about 50 wt-% based on the total weight of the transfer layer. In an alternative embodiment of the present invention, the intermediate transfer layer donor binder is present in an amount of from about 20 wt-% to about 35 wt-% based on the total weight of the transfer layer.

Cationic Infrared Absorbing Dye

The cationic infrared absorbing dye (also referred to as a cationic IR absorbing dye, a cationic IR dye, thermal absorbing agent or a photothermal converting dye) used in the system of the present invention is a light-to-heat converter. Cationic infrared absorbing dyes produce transparent films when combined with the binder polymers and other components of the transfer material described herein. In contrast, neutral dyes, such as squarylium and croconium dyes, produce dispersion aggregates resulting in coatings with visible agglomerated pigments. Also, anionic dyes are incompatible with the transfer layer material of the present invention, and result in flocculation of the pigment dispersion.

In one embodiment of the present invention, the cationic IR absorbing dye is a bleachable dye, meaning that it is a dye capable of being bleached. Bleaching of the dye means that there is an effective diminution of absorption bands that give rise to visible coloration of the cationic IR absorbing dye. Bleaching of the cationic IR absorbing dye may be achieved by destruction of its visible absorption bands, or by shifting them to wavelengths that do not give rise to visible coloration, for example.

Suitable cationic IR absorbing dyes for use in the second layer of the present invention are selected from the group of tetraarylpolymethine (TAPM) dyes, amine cation radical dyes, and mixtures thereof. Preferably, the dyes are the tetraarylpolymethine (TAPM) dyes. Dyes of these classes are typically found to be stable when formulated with the other ingredients of the present invention and to absorb in the correct wavelength ranges for use with the commonly available laser sources. Furthermore, the cationic IR absorbing dyes of the present invention are believed to react with the thermally activated crosslinking in the transfer layer when photoexcited by laser radiation. This reaction not only contributes to bleaching of the cationic infrared absorbing dye, but also leads to crosslinking of the second donor binder, as described in greater detail below. It is also believed that the thermally activated crosslinking agent of the present invention stabilizes the cationic IR absorbing dyes, such that the cationic infrared absorbing dyes retain absorption properties for a greater length of time as the donor element ages.

Yet another useful property shown by many of these cationic IR absorbing dyes is the ability to undergo thermal bleaching by nucleophilic compounds and reducing agents that may be incorporated in a receptor element, as is described in greater detail below.

TAPM dyes comprise a polymethine chain having an odd number of carbon atoms (5 or more), each terminal carbon atom of the chain being linked to two aryl substituents. These generally absorb in the 700 nm to 900 nm region. There are several references in the literature to their use as cationic IR absorbing dyes when exposed to laser radiation, e.g., JP Publication Nos. 63-319191 (Showa Denko) and 63-319192 (Shonia Denko), U.S. Pat. No. 4,950,639 (DeBoer), and EP 602 893 (3M) and 0 675 003 (3M). When these cationic IR absorbing dyes are co-transferred with dispersible material such as pigment, a blue cast is given to the transferred image because the TAPM dyes generally have absorption peaks that tail into the red region of the spectrum However, this problem is solved by means of the bleaching processes described in greater detail below.

In one embodiment of the present invention the dyes of the TAPM class have a nucleus of formula (IIIa):

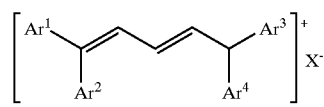

wherein each $Ar^1$, $Ar^2$, $Ar^3$ and $Ar^4$ is aryl and at least one (and more preferably at least two) aryl has a cationic amino substituent (preferably in the 4-position), and X is an anion. Preferably no more than three (and more preferably no more than two) of said aryl bear a tertiary amino group. The aryl bearing said tertiary amino groups are preferably attached to different ends of the polymethine chain ($Ar^1$ or $Ar^2$ and $Ar^3$ or $Ar^4$ have tertiary amino groups).

Examples of tertiary amino groups include dialkylamino groups (such as dimethylamino, diethylamino, etc.), diarylamino groups (such as diphenylamino), alkylarylamino groups (such as N-methylanilino), and heterocyclic groups such as pyrrolidino, morpholino, or piperidino. The tertiary amino group may form part of a fused ring system.

The aryl groups represented by $Ar^1$, $Ar^2$, $Ar^3$ and $Ar^4$ may comprise phenyl, naphthyl, or other fused ring systems, but phenyl rings are preferred. In addition to the tertiary amino groups discussed previously, substituents which may be present on the rings include alkyl groups (preferably of up to 10 carbon atoms), halogen atoms (such as Cl, Br, etc.), hydroxy groups, thioether groups and alkoxy groups. In another embodiment of the present invention, substituents such as alkoxy groups donate electron density to the conjugated system. Substituents, especially alkyl groups of up to 10 carbon atoms or aryl groups of up to 10 ring atoms, may also be present on the polymethine chain.

In one embodiment of the present invention, the anion (X) is derived from a strong acid and HX should have a pKa of less than 3 or less than 1. Suitable identities for X include $ClO_4$, $BF_4$, $CF_3SO_3$, $PF_6$, $AsF_6$, $SbF_6$ and perfluoroethylcyclohexylsulphonate.

Cationic polymethine dyes that can be bleached by reacting with various bleaching agents used in another embodiment of the invention have the following structures:

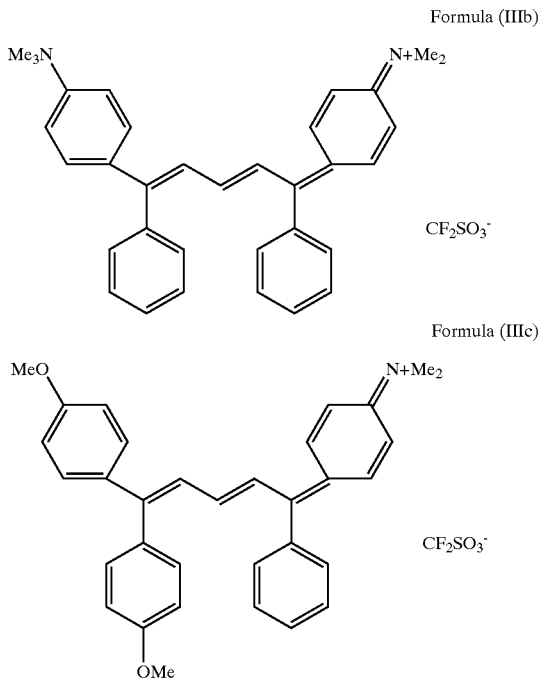

Formula (IIIb)

Formula (IIIc)

The TAPM dyes of formula (III) may be synthesized by known methods, such as by conversion of the appropriate benzophenones to the corresponding 1,1-diarylethylenes (by the Wittig reaction, for example), followed by reaction with a trialkyl orthoester in the presence of strong acid HX.

Alternative cationic infrared absorbing dyes, although not as readily bleached as the TAPM dyes, include the class of amine cation radical dyes (also known as immonium dyes) disclosed, for example, in International Publication No. WO 90/12342 and JP Publication No. 51-88016 (Canon). Included in this class of amine cation radical dyes are the diamine dication radical dyes (in which the chromophore bears a double positive charge), exemplified by materials such as CYASORB IR165, commercially available from Glendale Protective Technologies Inc., Lakeland, Fla. Such diamine dication radical dyes have a nucleus of the following general formula (IV):

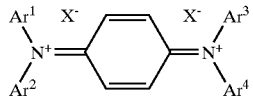

in which $Ar^1$, $Ar^2$, $Ar^3$ and $Ar^4$ and X are as defined above. Diamine dication radical dyes typically absorb over a broad range of wavelengths in the near infrared region, making them suitable for address by YAG lasers as well as diode lasers. Although diamine dication radical dyes show peak absorption at relatively long wavelengths (approximately 1050 nm, suitable for YAG laser address), the absorption band is broad and tails into the red region, which gives a blue cast to the transferred image. As discussed above, this problem is solved by means of a bleaching process described in greater detail below.

The bleachable cationic infrared absorbing dye is present in a sufficient quantity to provide an absorbance of at least about 0.5, at the exposing wavelength. In an alternative embodiment the cationic IR absorbing dye is present in a sufficient quantity to provide an absorbance of at least about 0.75, at the exposing wavelength. In yet another embodiment, the cationic IR absorbing dye is present in a sufficient quantity to provide an absorbance of at least about 1.0, at the exposing wavelength. Typically, this is accomplished with from about 5 wt-% to about 20 wt-% cationic IR absorbing dye, based on the weight of the transfer layer. Similarly, the cationic infrared absorbing dye can be present in an amount of from about 5 from about 5 wt-% to about 20 wt-% cationic IR absorbing dye, based on the weight of the intermediate transfer layer.

Intermediate Transfer Layer Crosslinking Agent

In one embodiment of the present invention the intermediate transfer layer is crosslinked. This is accomplished by adding an intermediate transfer layer crosslinking agent such as the Desmodur aromatic polyisocyanate crosslinker available under the trade designation DESMODUR CB55N and an intermediate transfer layer crosslinking catalyst such as dibutyltin dilaureate to the intermediate transfer layer binder and subjecting the coated intermediate transfer layer to drying and/or baking. The crosslinking reaction is maximized by placing the coated intermediate transfer layer in baking conditions of about 190° F. for from about 2 to 4 hours. In an alternative embodiment of the present invention, the intermediate transfer layer is allowed to dry in ambient conditions.

Alternative intermediate transfer layer crosslinking agents that may be used in the present invention include, for example, CYMEL 1133 from Cytec Industries, West Paterson, N.J., Phenolic Crosslinker GPRI7571 from Georgia Pacific Resins Inc., Atlanta, Ga., and RESIMENE 717 from UCB Surface Specialties, St. Louis, Mo.

In one embodiment of the present invention, the intermediate transfer layer crosslinking agent is present in an amount of from about 5 to about 30 wt-% based on the total weight of the intermediate transfer layer.

The crosslinking effect also prevents migration of the dispersible material and particularly where the dispersible material includes metallic flakes towards or potentially into the intermediate transfer layer from the transfer layer.

Thermally Activated Crosslinking Agent

It has been surprisingly discovered that inclusion of a thermally activated crosslinking agent in the transfer layer of the donor element results in significantly reduced degradation of the shelf life properties of the donor element while still maintaining the same imaging properties of donor elements, such as those reported in U.S. Pat. No. 5,935,758 (Patel et al.) and U.S. patent application Ser. No. 10/461,738 (Kidnie et al.), which include only a dihydropyridine crosslinking agent. Generally, the thermally activated crosslinking agent of the transfer layer of the present invention can be a resinous phenolic compound. A phenolic resin is a low molecular weight polymer (or oligomer) produced from phenol and formaldehyde in a condensation reaction. There are two major types of commercial phenolic resin: Novolacs as represented generally by formula (Ib) and Resols as represented generally by formula (Ic). Novolacs are indirectly hardening resins and generally require an extra curing agent to obtain a crosslinked resin. Resols cure directly upon the addition of heat.

More specifically, the thermally activated crosslinking agent of the transfer layer of the present invention is a compound having a nucleus of formula (Ia):

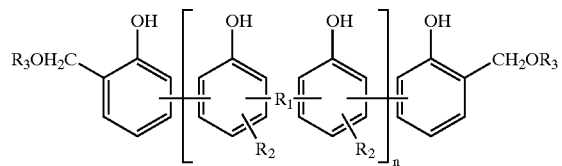

wherein n can be 0 to 50; $R_1$ is $CH_2$ or $CH_2OCH_2$ at either the ortho- or para-position; $R_2$ is alkyl at the meta-position when $R_1$ is para or at the para-position when $R_1$ is ortho; $R_3$ can be independently hydrogen or butyl.

The thermally activated crosslinking agent of formula (Ia) is particularly suited to crosslink with the donor binder of the transfer layer, which further promotes the LIFT mechanism of the present invention. The thermally activated crosslinking agent of formula (Ia) can react with the free hydroxyl groups of the donor binder of the transfer layer, particularly where the donor binder is a hydroxylic polymer such as polyvinyl butyral during imaging. Prior to imaging, there is essentially no crosslinking that occurs between the thermally activated crosslinking agent of formula (Ia) and the free hydroxyl groups of the donor binder of the transfer layer. The free hydroxyl groups in polyvinyl butyral present a point of chemical reactivity through which the thermally activated crosslinking agent may also be insolubilized.

In one embodiment of the present invention, the thermally activated crosslinking agent is one that is typically only reactive in the system when exposed to thermal energy such as that provided by laser radiation. The crosslinking effect during laser imaging results in a high quality transferred dot formed of a dispersible material with well-defined, generally continuous, and relatively sharp edges. It also prevents retransfer of the dispersible material back to the donor, as well as back transfer of the dispersible material to the donor in a subsequent imaging step. This greatly simplifies the imaging process, as well as yielding more controllable film transfer.

The thermally activated crosslinking agent of formula (Ia) has the additional property of being slightly acidic, which promotes stability of the cationic infrared absorbing dye. The slightly acidic environment provided by inclusion of the thermally activated crosslinking agent of the present invention reduces the change of pre-mature bleaching of the cationic infrared absorbing dye of the present invention, by materials that can act as a bleaching agent of the cationic infrared absorbing dye. Bleaching of the cationic infrared absorbing dye can occur with age and reduces the absorbance of the dye, which results in reduced absorbance of thermal energy by the donor element during imaging. This in turn decreases the ability to produce high quality transferred dots with well-defined, generally continuous, a relatively sharp edges.

In an alternative embodiment of the present invention, the thermally activated crosslinking agent is a slightly modified phenolic resin (an etherified phenol formaldehyde crosslinker) of formulas (Ib) and (Ic):

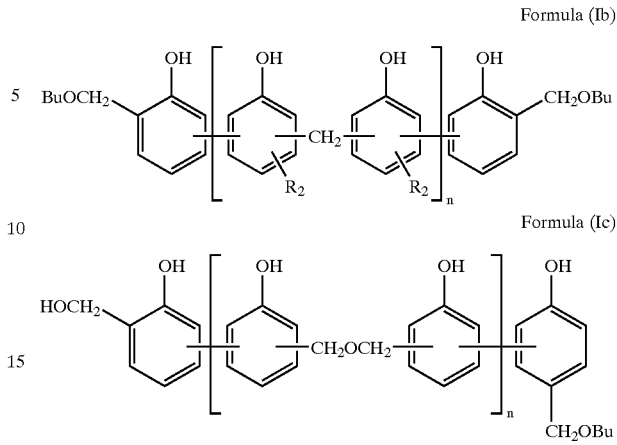

wherein n is 1–50 and $R_2$ can be independently hydrogen or alkyl.

In one embodiment of the present invention, the thermally activated crosslinking agent is present in an amount of from about 1 wt-% to about 10 wt-% based on the total weight of the transfer layer. In an alternative embodiment of the present invention, the thermally activated crosslinking agent is present in an amount of from about 3 wt-% to about 7 wt-% based on the total weight of the transfer layer.

Suitable thermally activated crosslinking agents are available as DURITE®SD-780 phenolic flake resin from Borden Chemical, Inc., Louisville, Ky.; CK-2500 from Georgia Pacific, of Atlanta, Ga.; and SANTOLINK EP 560 from Easttech Chemical, Inc. of Philadelphia, Pa.

Fluorocarbon Additive

The transfer layer can also include a fluorocarbon additive for enhancing transfer of a molten or softened film and production of half tone dots (pixels) having well-defined, generally continuous, and relatively sharp edges. Under the conditions used to prepare images using the system of the present invention, the fluorocarbon additive serves to reduce the cohesive forces within the transfer layer at the interface between the areas exposed to laser radiation and the areas not exposed to laser radiation and thereby promotes clean "shearing" of the transfer layer in the direction perpendicular to its major surface. This provides improved integrity of the dots with sharper edges, as there is less tendency for "tearing" or other distortion as the transferred dots separate from the rest of the second layer. Thus, unlike dye transfer systems in which just the colorant is transferred, and unlike ablation transfer systems in which gases are typically formed that propel the colorant toward the receptor, the system of the present invention forms images by transfer of the dispersible material, binder and other additives, in a molten or softened state as a result of a change in cohesive forces. The change in cohesive forces assists in limiting the domain of the transferred material, thus, providing more control of the dot size.

As stated in the background, an effect of the propulsive forces in an ablative system, however they are formed, is a tendency for the colorant to "scatter," producing less well-defined dots made of fragments. In contrast, the system of the present invention produces dots formed from and transferred as a molten or softened film of material (binder, dispersible material and additives). It is believed that the fluorocarbon additive promotes controllable flow of the material from the transfer layer to a receptor element in a molten or softened state. This mechanism is similar to what occurs in conventional thermally induced wax transfer systems, however, the molten or softened material of the transfer layer of the present invention does not uncontrollably wick across to the receptor and spread over the surface of the receptor. Rather, the system of the present invention involves a more controlled mechanism in which the material melts and/or softens and transfers. This controlled mechanism results in reduced dot gain and high resolution, relative to thermally induced wax transfer systems.

A wide variety of compounds may be used as the fluorocarbon additive provided they are substantially involatile under normal coating and drying conditions, and sufficiently miscible with the donor binder. Thus, highly insoluble fluorocarbons, such as polytetrafluoroethylene and polyvinylidenefluoride, are unsuitable, as are gases and low boiling liquids, such as perfluoralkanes. With the above exceptions, both polymeric and lower molecular weight materials may be used. In one embodiment of the present invention, the fluorocarbon additive is selected from compounds comprising a fluoroaliphatic group attached to a polar group or moiety and fluoropolymers having a molecular weight of at least about 750 and comprising a nonfluorinated polymeric backbone having a plurality of pendant fluoroaliphatic groups, which aliphatic groups comprise the higher of: (a) a minimum of three CF bonds; or (b) in which 25% of the CH bonds have been replaced by CF bonds such that the fluorochemical comprises at least 15% by weight of fluorine.

Suitable fluorocarbon additives are disclosed in EP 602 893 (3M) and the references cited therein. In one embodiment of the present invention, the fluorocarbon additive is a sulfonamido compound $(C_8F_{17})SO_2 NH(CH_2CH_3)$ (N-ethyl perfluorooctanesulfonamide), which includes 70% straight chains and 30% branched chains. The fluorocarbon additive is typically used in an amount of from about 0.5 to 5 wt-%, based on the total weight of the transfer layer.

Dispersible Material

The dispersible material (also referred to as the "dispersed" material when dispersed within the transfer layer) includes a particulate material that is of sufficiently small particle size that it can be dispersed within the transfer layer, with or without the aid of a dispersant. Suitable dispersible materials for use in the transfer layer typically include colorants such as pigments and crystalline nonsublimable dyes. Other suitable dispersible materials of the present invention include metallic flake pigments, which are described in U.S. patent application Ser. No. 10/461,738 (Kidnie et al.).

The pigment(s) or nonsublimable dye(s) in the transfer layer are those typically used in the printing industry. Thus, the dispersible materials may be of a variety of hues. Alternatively, the dispersible materials may not necessarily add color but simply enhance the color or they may be clear or colorless and provide a texturized image.

Essentially any dye, pigment or mixture of dyes and/or pigments of the desired hue and/or metallics may be used as a dispersible material in the transfer layer. They are generally insoluble in the transfer layer composition and are nonsublimable under imaging conditions at atmospheric pressures. They should also be substantially unreactive with the bleaching agent in the receptor under both ambient conditions and during the imaging process.

Dispersible materials that enhance color include, for example, fluorescent, pearlescent, iridescent, and metallic materials. Materials such as silica, polymeric beads, reflective or non-reflective glass beads may also be used as the dispersible material to provide a textured image. Such materials are typically colorless, although they may be white or have a color that does not detract from the color of the pigment, for example, and can be referred to as texturizing materials.

In an embodiment of the present invention, pigments and crystalline nonsublimable polymeric dyes are used because they have a lower tendency for migration between the intermediate transfer layer and the transfer layer. Further, pigments are used due to the wide variety of colors available, their lower cost, and their greater correlation to printing inks. Pigments in the form of dispersions of solid particles typically have a much greater resistance to bleaching or fading on prolonged exposure to sunlight, heat, and humidity in comparison to soluble dyes, and hence can be used to form durable images. The use of pigment dispersions in color proofing materials is well known in the art, and any of the pigments previously used for that purpose may be used in the present invention. In one embodiment of the present invention, pigments or blends of pigments matching the yellow, magenta, cyan, and black references provided by the International Prepress Proofing Association (known as the SWOP color references) are used although the invention is by no means limited to these colors. Pigments of essentially any color may be used, including those conferring special effects such as opalescence, fluorescence, UV absorption, IR absorption, and ferromagnetism, for example.

In one embodiment of the present invention the second layer of the donor element contains a sufficient amount of dispersible material to provide a transmission optical density (TOD) of at least about 0.4 at the relevant viewing wavelength. In another embodiment, the transfer layer of the donor element contains a sufficient amount of dispersible material to provide a TOD of at least about 0.8 at the relevant viewing wavelength. The TOD is a measurement that indicates the amount of color available prior to imaging and is related to the reflection optical density (ROD), which is a measurement taken after imaging. The TOD is generally about half the value of the resulting ROD. For a suitable donor of the present invention, the ROD of a standard magenta donor can range from about 1.30 to about 1.45. Alternatively, the ROD of a high density magenta donor would range from about 1.40 to about 1.60. One of ordinary skill in the art would be able to determine the appropriate usage amounts for each color variation for the donor element. In one embodiment of the present invention, the dispersible material is present in an amount of from about 15 to about 50 wt-%, based on the total weight of the transfer layer. In an alternative embodiment of the present invention involving a multi-layer construction and having metallic flakes as the dispersible material, the metallic flakes are generally present in a sufficient quantity to provide an acceptable visual effect. Typically, this is accomplished with about 20 wt-% to about 50 wt-% of metallic flake pigment, based on the total weight of the transfer layer.

Pigments are generally introduced in the form of a millbase comprising the pigment dispersed with a binder and suspended in a solvent or mixture of solvents. The dispersion process may be accomplished by a variety of methods well known in the art, such as two-roll milling, three-roll milling, sand milling, and ball milling. Many different pigments are available and are well known in the art. The pigment type and color are chosen such that the coated color proofing element is matched to a preset color target or specification set by the industry.

The type and amount of binder used in the dispersion is dependent upon the pigment type, surface treatment on the pigment, dispersing solvent, and milling process. The binder is typically the same hydroxylic polymer described above. In one embodiment of the present invention, the binder is a polyvinyl acetal such as a polyvinyl butyral available under the trade designation BUTVAR B-76 from Monsanto, St. Louis, Mo.

Optional Additives

Coating aids, dispersing agents, optical brighteners, UV absorbers, fillers, plasticizers, etc., can also be incorporated into the pigment mill base, or in the overall compositions of the transfer layer and intermediate transfer layer.

Dispersing agents (also referred to as dispersants) may be necessary to achieve optimum dispersion quality. Some examples of dispersing agents include, for example, polyester/polyamine copolymers, alkylarylpolyether alcohols, acrylic resins, and wetting agents. In one embodiment of the present invention the dispersant is a block copolymer with pigment affinity groups, available under the trade designation DISPERBYK 161 from Byk-Chemie USA, Wallingford, Conn. In one embodiment of the present invention, the dispersing agent is used in an amount of from about 0.5 wt-% to about 2 wt-%, based on total weight of the transfer layer or intermediate transfer layer.

Surfactants may be used to improve solution stability. A wide variety of surfactants can be used. One surfactant is a fluorocarbon surfactant used to improve coating quality. Suitable fluorocarbon surfactants include fluorinated polymers, such as the fluorinated polymers described in U.S. Pat. No. 5,380,644 (Yonkowski, et al.). In one embodiment of the present invention a surfactant is used in an amount of at least about 0.005 wt-% based on the total weight of the first layer or second layer. In another embodiment the usage amount is no greater than from about 0.01 to 0.1 wt-%, and typically in an amount of no greater than from about 0.1 to 0.2 wt-%, based on the total weight of the transfer layer or the intermediate transfer layer.

Preparation of the Donor Element

The donor element may be coated as one or more contiguous layers. In one embodiment of the present invention, the donor element has a single layer (the transfer layer) disposed on the donor substrate. In another embodiment, the donor element includes at least two layers. In this embodiment the intermediate transfer layer is disposed on the donor substrate, and therefore lies intermediate the substrate and a distinct transfer layer.

As previously stated, the transfer layer includes the donor binder, the cationic IR absorbing dye, the thermally activated crosslinking agent and the dispersible material. In a particular embodiment, the dispersible material is a metallic flake. The intermediate transfer layer includes the intermediate transfer layer donor binder and the cationic IR absorbing dye. The fluorocarbon additive and optional additives may also be added to both the intermediate transfer layer and the transfer layers.

The intermediate transfer layer the transfer layer compositions of the donor element are readily prepared by dissolving or dispersing the various components in a suitable solvent, typically an organic solvent, and coating the mixture on a substrate. The solvent is typically present in an amount of at least about 80 wt-%.

The organic solvent is typically an alcohol, a ketone, an ether, a hydrocarbon, a haloalkane, or mixtures thereof. Suitable solvents include, for example, methanol, ethanol, propanol, 1-methoxy ethanol, 1-methoxy-2-propanol, methyl ethyl ketone, methyl iso butyl ketone, diethylene glycol monobutyl ether (butyl CARBITOL), and the like. Typically, a mixture of solvents is used, which assists in controlling the drying rate and avoiding forming cloudy films. An example of such a mixture is methyl ethyl ketone, ethanol, and 1-methoxy propanol.

In one embodiment of the present invention, the intermediate transfer layer donor binder, BUTVAR B-72 polyvinyl butyral, has limited solubility in methyl ethyl ketone. Therefore a combination of methyl ethyl ketone and ethanol is typically used for preparation and coating of the intermediate transfer layer of the donor element.

To prepare the transfer layer composition of one embodiment of the present invention, a single solvent such as methyl isobutyl ketone can be chosen to prevent interactions between the intermediate transfer layer and the transfer layer. In another embodiment, when the intermediate transfer layer includes an intermediate transfer layer crosslinking agent, it is possible to use a single solvent such as methyl ethyl ketone to prepare the intermediate transfer layer and the transfer layer of the donor element.

In embodiments that include metallic flakes, the metallic flakes of the transfer layer are most conveniently prepared by predispersing the metallic flakes in the hydroxylic polymer in roughly equal proportions by weight with solvents and dispersants. The metallic flake dispersions are typically prepared by simple mixing methods. High shear mixing should be avoided to minimize fracture of the metallic flake particles. Any of the standard coating methods may be employed, such as roller coating, knife coating, gravure coating, and bar coating, followed by drying at moderately elevated temperatures.

The relative proportions of the components of the donor element may vary widely, depending on the particular choice of ingredients and the type of imaging required. In one embodiment of the present invention, the following approximate composition (in which all percentages are based on the total weight of the respective layer) can be used for a standard magenta donor:

| Intermediate Transfer Layer Composition: | |
|---|---|
| hydroxylic polymer (e.g., BUTVAR B72 available from Solutia, Inc. St. Louis, MO) | about 50 to 95 wt-% |
| cationic IR absorbing dye (e.g. PC 364 available from St. Jean Chemicals, Inc. Quebec, Canada) | about 5 to 20% |
| Transfer Layer Composition: | |
| hydroxylic polymer (e.g., BUTVAR B76 available from Solutia, Inc. St. Louis, MO) | about 20 to 50 wt-% |
| cationic IR absorbing dye (e.g. PC 364 available from St. Jean Chemicals, Inc. Quebec, Canada) | about 5 to 20 wt% |
| thermally activated crosslinking agent (e.g. CK-2500 available from Georgia Pacific, Atlanta, GA) | about 1 to 10 wt% |
| dispersible material (e.g. RS 209 MAG MB available from Clariant, Sulzbach an Tun, Germany) | about 15 to 50 wt% |

In one embodiment of the present invention, the compositions for the intermediate transfer layer and/or transfer layer are dissolved in an appropriate solvent to form an intermediate transfer layer solution and/or a transfer layer solution. Thus, the remainder of the intermediate transfer layer and/or the transfer layer can be solvent. Generally, at least about 80 wt-% of the intermediate transfer layer solution and/or transfer layer solution is solvent.

In another embodiment of the present invention, the intermediate transfer layer further includes the intermediate layer crosslinking agent in an amount of from about 26 to 50 wt-%, based on the weight of the intermediate transfer layer.

In one embodiment of the present invention, the coating weight of the intermediate transfer layer is from about 20 to 60 mg/ft$^2$. In another embodiment the intermediate transfer layer coating weight is from about 30 to 50 mg/ft$^2$. With respect to the transfer layer, in one embodiment of the present invention the coating weight is from about 70 to 90 mg/ft$^2$. In another embodiment, the transfer layer coating weight is from about 40 to 120 mg/ft$^2$.

Thin coatings of less than about 3 $\mu$m dry thickness of the transfer layer may be transferred to a variety of receptor sheets by exposure to thermal energy such as laser radiation. Although primarily designed for transfer to paper or similar receptors for color proofing purposes, transfer material compositions described herein may alternatively be transferred to a wide variety of substrates.

Receptor

The receptor to which the image is transferred, whether it be an intermediate receptor in an indirect transfer or a final receptor in a direct transfer, typically includes a substrate on which is coated a receptor binder and typically a bleaching agent. In another embodiment of the present invention, the receptor includes optional additives such as particulate material, surfactants, and antioxidants. The receptor may additionally include the cationic IR absorbing dyes also used in the intermediate transfer layer and transfer layer of the donor element. The final receptor used in an indirect transfer process can be any receptor that will accept the image and strippable adhesive. This includes plain paper, coated paper, glass, polymeric substrates, and a wide variety of other substrates.

In one embodiment of the present invention, the intermediate receptor includes a polyethylene terephthalate sheet (75–150 $\mu$m thick) on which is coated a strippable layer having an acrylic or a vinyl acetate adhesive. On this is coated a dispersion of a receptor binder, a bleaching agent, and particulate material to form a receiving layer. The dispersion is typically coated out of water or an organic solvent. Suitable organic solvents include those listed above to coat the first layer and second layer onto a substrate for preparation of the donor element, as well as others such as toluene, for example.

The receptor is chosen based on the particular application. Receptors may be transparent or opaque. Suitable receptors include coated paper, metals such as steel and aluminum; films or plates composed of various film-forming synthetic or high polymers including addition polymers such as poly(vinylidene chloride), poly(vinyl chloride), poly(vinyl acetate), polystyrene, polyisobutylene polymers and copolymers, and linear condensation polymers such as poly(ethylene terephthalate), poly(hexamethylene adipate), and poly(hexamethylene adipamide/adipate). The receptor may be transparent or opaque. Nontransparent receptor sheets may be diffusely reflecting or specularly reflecting.

In one embodiment of the present invention, the receptor comprises a texturized surface. That is, the receptor includes a support bearing a plurality of protrusions. The protrusions can be obtained in a variety of ways. For example, particulate material may be used to form the protrusions. Alternatively, the support may be microreplicated, thereby forming the protrusions. This is discussed in greater detail below.

For color imaging, the receptor may include paper (plain or coated) or a plastic film coated with a thermoplastic receiving layer. The thermoplastic receiving layer is typically several micrometers thick and may comprise a thermoplastic resin capable of providing a tack-free surface at ambient temperatures, and which is compatible with the portions of the second layer transferred to the receptor. The receptor may advantageously contain a bleaching agent for the cationic IR absorbing dye, as taught in EP 675 003. Bleaching agents for use in the system of the present invention are discussed below.

A suitable receptor layer comprises PLIOLITE S5A containing diphenylguanidine as a bleaching agent in an amount of from about 2 to 25 wt % of the receptor element and 8 $\mu$M diameter beads of poly(stearyl methacrylate) in an amount of from about 0.2 to 2.5 wt % of total solids, coated at about 5.9 g/m$^2$. Alternatively, the receptor layer comprises BUTVAR-B76. The hydroxylic polymer binder is present in an amount of from about 70 to 90 wt-% based on the total weight of the receptor layer.

Texturizing Material

The receptor may be textured with particulate material or otherwise engineered so as to present a surface having a controlled degree of roughness. That is, the receptor of the present invention includes a support bearing a plurality of protrusions that project above the outer surface of the receptor substrate. The protrusions may be created by incorporating polymer beads or silica particles, for instance, in a binder to form a receiving layer, as disclosed, for example, in U.S. Pat. No. 4,876,235 (DeBoer). Microreplication may also be used to create the protrusions, as disclosed in EP 382 420 (3M).

When one (or both) of the donor and receptor sheets presents a roughened surface, vacuum draw-down of the one to the other is facilitated. Although the use of particulate material in color proof systems is known, as disclosed in U.S. Pat. No. 4,885,225 (Heller, et al.), for example, it has been discovered that the protrusions on the receptor significantly enhance transfer of the second layer of the present invention and thereby the image quality. Without such protrusions in (or on) the receptor surface, there can be a tendency for dust artifacts and mottle to result in small areas (approximately 1 mm) of no image transfer.

The protrusions in the receptor regulate precisely the relationship between the donor and the receptor. That is, the protrusions are believed to provide channels for air that would otherwise be trapped between the donor and receptor to escape so there is uniform contact between the donor and the receptor over the entire area, which is otherwise impossible to achieve for large images. More importantly, the protrusions are believed to prevent entrapment of air in the transferred imaged areas. As the molten or softened film transfers to the receptor in a given area the air can escape through the channels formed by the protrusions.

The protrusions provide a generally uniform gap between the donor and the receptor, which is important for effective film transfer. The gap is not so large that ablative transfer occurs during imaging upon exposure to laser radiation. Preferably, the protrusions are formed from inert particulate material, such as polymeric beads.

The beads or other particles may be of essentially uniform size (a monodisperse population) or may vary in size. Dispersions of inorganic particles such as silica generally have a range of particle sizes, whereas monodisperse suspensions of polymer beads are readily available. The particles should not project above the surface of the receptor substrate by more than about 8 $\mu$m on average, but should project above the surface of the receptor substrate by at least about 1 $\mu$m, or alternatively by at least about 3 $\mu$m. The composition of the polymeric beads is generally chosen such that substantially all of the visible wavelengths (400 nm to 700 nm) are transmitted through the material to provide optical transparency. Nonlimiting examples of polymeric beads that have excellent optical transparency include polymethylmethacrylate and polystearyl methacrylate beads, described in U.S. Pat. No. 2,701,245 (Lynn); and beads comprising diol dimethacrylate homopolymers or copolymers of these diol dimethacrylates with long chain fatty alcohol esters of methacrylic acid and/or ethylenically unsaturated comonomers, such as stearyl methacrylate/hexanediol diacrylate crosslinked beads, as described in U.S. Pat. Nos. 5,238,736 (Tseng, et al.) and U.S. Pat. No. 5,310,595 (Ali et al.).

The shape, surface characteristics, concentration, size, and size distribution of the polymeric beads are selected to optimize performance of the transfer process. The smoothness of the bead surface and shape of the bead may be chosen such that the amount of reflected visible wavelength (400 nm to 700 nm) of light is kept to a minimum. This may or may not be an issue depending upon the actual substrate used. For example, if the color proof is formed on a transparent substrate, the haze introduced by the presence of the beads may be effected by the color. The shape of the beads can be spherical, oblong, ovoid, or elliptical. In some constructions, it is advantageous to add two distinct sets of beads with different average sizes. This allows the flexibility to balance haze with slip or separation characteristics.

The optimum particle size depends on a number of factors, including the thickness of the receptor, the thickness of the transfer layer of the donor element, and the number of layers to be transferred to a given receptor. In general, the projections provided by the particles must be great enough not to be obscured by the first layer(s) transferred to the receptor. If the average projection is significantly greater than about 8 μm, however, transfer of the transfer material as a coherent film becomes generally impossible, and the quality of the transferred image deteriorates markedly.

In the case of polydisperse populations of particles, such as silica particles, excellent results have been obtained when the largest of said particles project above the surface of the receptor substrate by about 4 μm As an alternative to the use of beads or particles the receptor surface may be physically textured to provide the required protrusions. Metal surfaces, such as aluminum, may be textured by graining and anodizing. Other textured surfaces may be obtained by microreplication techniques, such as those disclosed in EP 382 420 (3M).

The extent of the protrusions on the receptor surface, whether formed by bead, particles, or texturing, may be measured, for example, by interferometry or by examination of the surface using an optical or electron microscope.

An example of a final receptor for direct imaging is the MATCHPRINT Low Gain Commercial Base manufactured by Schoeller Technical Paper Sales, Inc. of Pulaski, N.Y. This receptor is a heat stable, waterproof material that includes a paper sheet sandwiched between two polyethylene layers.

Binder

The receptor binder comprises a crosslinkable binder, such as that used in the transfer layer of the donor element, which is a hydroxylic polymer (a polymer having a plurality of hydroxy groups). In one embodiment of the present invention, 100% of the binder is a hydroxylic polymer. Another binder for use in the receiving layer is a polyvinyl pyrrolidone/vinyl acetate copolymer binder available under the trade designation E-735 from GAF, Manchester, UK. Another binder is a styrene-butadiene copolymer available under the trade designation PLIOLITE S5C from Goodyear, Akron, Ohio. Yet another binder is a phenoxy polymer available under the trade designation PAPHEN PKHM-301 from Phenoxy Associates. This latter binder is particularly compatible with guanidines, thereby allowing for higher loading of the guanidines. Other additives may also be present, such as surfactants and antioxidants.

Bleaching Agent

A problem common to many imaging system is the fact that unless the cationic IR absorbing dye is completely colorless, the fiat image is contaminated and not a true color reproduction, and hence unacceptable for high quality proofing purposes. For example, if the cationic IR absorbing dye is transferred to a receptor during imaging, it can visibly interfere with the color produced because it absorbs slightly in the visible region of the spectrum. Attempts have been made to find cationic IR absorbing dyes with minimal visible absorption, as in, for example, EP 157 568 (ICI). In practice, however, there is nearly always some residual absorption, which has limited the usefulness of the technology.

Suitable thermal bleaching agents (also referred to as bleaching agents) do not require exposure to light to become active, but will bleach the cationic IR dyes at ambient or elevated temperatures. The term "bleaching" means a substantial reduction in absorption giving rise to color visible to the human eye, regardless of how this is achieved. For example, there may be an overall reduction in the intensity of the absorption, or it may be shifted to noninterfering wavelengths, or there may be a change in shape of the absorption band, such as, a narrowing, sufficient to render the cationic IR absorbing dye colorless.

Suitable thermal bleaching agents include nucleophiles, such as an amine or a salt that decomposes thermally to release an amine, or a reducing agent, as described in EP 675 003 (3M). In one embodiment of the present invention, the bleaching agents are amines such as guanidine or salts thereof, wherein the guanidine bleaching agents have the following general formula (V):

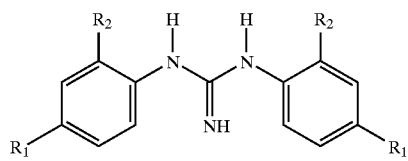

where each $R^1$ and $R^2$ is independently hydrogen or an organic group or hydrogen or an alkyl group, such as a $C_1$–$C_4$ alkyl group. Such diphenyl guanidines are commercially available from Aldrich Chemical Company, Milwaukee, Wis., or can be synthesized by reaction of cyanogen bromide with the appropriate aniline derivatives.

Guanidines have good stability, solubility, and compatibility with the binders disclosed herein. They are solids as opposed to liquids, and are rapid acting. Solids are advantageous because they are involatile at room temperature. They are relatively small molecules that diffuse very effectively into the transferred material when heated. Significantly, they do not discolor during storage, do not precipitate out of solvent-based systems prior to coating onto a substrate.

Another bleaching agent suitable for use in the practice of the present invention is 1-(o-tolyl)biguanide, which is represented by formula (VI):

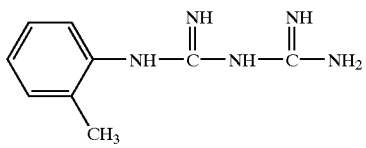

1-(o-tolyl)biguanide is available commercially from Sigma-Aldrich Corp., St. Louis, Mo.; product number 42,466-8) and is reported in U.S. Provisional Pat. Appl'n. No. 60/506,472 (Kidnie, et al.), which is incorporated by reference. 1-(o-tolyl)biguanide can also be readily synthesized using conventional methods. The compound is solid at room temperature. 1-(o-tolyl)biguanide has good stability, solubility, and compatibility with the binders disclosed herein.

1-(o-tolyl)biguanide acts as a thermal bleaching agent towards certain IR dyes (such as tetraarylpolymethine dyes) which are frequently used as photothermal converters in media for thermal transfer imaging. 1(-o-tolyl)biguanide is also a fast-acting bleaching agent.

Another class of bleaching agent capable of bleaching the cationic IR absorbing dyes includes the 1,4-dihydropyridines of formula (IIa):

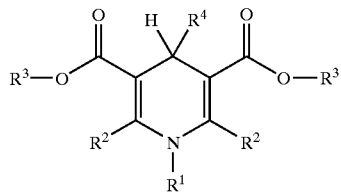

where $R^4$ is hydrogen or an alkyl group, such as an alkyl group having up to 5 carbon atoms. Such compounds bleach TAPM dyes of formula (III) in which no more than three of the aryl groups represented by $Ar^1$, $Ar^2$, $Ar^3$ and $Ar^4$ bear a tertiary amino substituent. This particular compound is further described in U.S. Pat. No. 5,935,758 (Patel et al.) and U.S. patent application Ser. No. 10/461,738 (Kidnie et al.), which are both incorporated by reference. The bleaching is believed to occur via a redox reaction. This class of bleaching agents is only partially effective in bleaching amine cation radical dyes.

Thermal bleaching agents of this type include:

Formula (IIb)

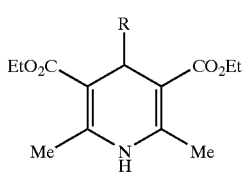

(where R is hydrogen or a $C_1$–$C_4$ alkyl group)

Formula (IIc)

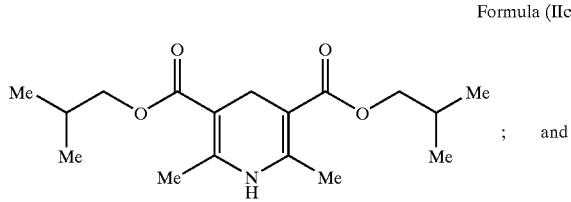

; and

Formula (IId)

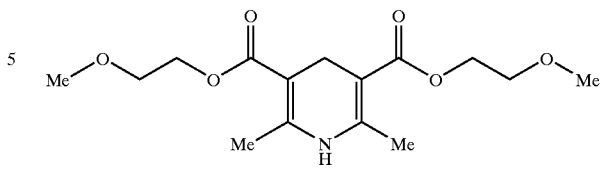

Whatever type of thermal bleaching agent is used, it is typically present prior to imaging in a receiving layer on the surface of the receptor element. It is equally possible, though, to deposit the thermal bleaching agent on the transferred image by appropriate means in an additional step subsequent to transfer of an image and separation of the donor and the receptor. Although the latter alternative requires an extra step, it has the advantage that no particular constraints are placed on the nature of the receptor, so that a variety of materials may be used for this purpose, including plain paper and conventional proofing bases. The former alternative, in which the bleaching agent is in a receiving layer on the receptor, streamlines the imaging process, but requires the use of a specially prepared receptor. In an alternative embodiment, the image residing on the receptor element after separating the donor and the receptor may be further transferred to a second receptor that comprises a layer containing a bleaching agent.

In on embodiment of the present invention, the bleaching agent is present in an amount of from about 2 wt-% to about 25 wt-%, based on the total weight of the receptor. In an alternative embodiment, the bleaching agent is present in an amount of from about 5 wt-% to about 20 wt-%, based upon the total weight of the receptor.

Optional Additives

Coating aids, optical brighteners, UV absorbers, plasticizers and fillers, for example, can also be incorporated into the overall receptor element composition. Surfactants may be used to improve solution stability. A wide variety of surfactants can be used. One surfactant is a fluorocarbon surfactant used to improve coating quality. Suitable fluorocarbon surfactants include fluorinated polymers, such as the fluorinated polymers described in U.S. Pat. No. 5,380,644 (Yonkoski, et al.). In one embodiment of the present invention, the fluorinated polymer is present in an amount of at least about 0.05 wt-%, based upon the total weight of a receptor layer. In another embodiment of the present invention, the fluorinated polymer is present in an amount of at least about 0.05 wt-% and no greater than about 5 wt-%, based upon the weight of the receptor layer. And in still another embodiment of the present invention, the fluorinated polymer is present in an amount of no greater than about 1–2 wt-%, based on the total weight of the receptor layer.

Preparation of the Receptor Element

Receptor layer compositions for use in the invention are readily prepared by dissolving or dispersing the various components in a suitable solvent, typically an organic solvent, and coating the mixture on a substrate. The solvent is typically present in an amount of at least about 80 wt-%. The organic solvent is typically an alcohol, a ketone, an ether, a hydrocarbon, a haloalkane, or mixtures thereof. Suitable solvents include, for example, methanol, ethanol, propanol, 1-methoxy ethanol, 1-methoxy-2-propanol, methyl ethyl ketone, diethylene glycol monobutyl ether (butyl CARBITOL), and the like. Typically, a mixture of solvents is used, which assists in controlling the drying rate and avoiding forming cloudy films.

The relative proportions of the components of the receptor layer may vary widely, depending on the particular choice of ingredients and the type of imaging required. In one embodiment of the present invention the receptor layer is obtained by coating the following formulation from methylethyl ketone (MEK) and toluene to provide a dry coating weight of 400 mg/ft$^2$ (4.3 µm$^2$):

| | |
|---|---|
| styrene butadiene (e.g. PLIOLITE S5A) | about 70 to 90 wt % |
| texturizing material (e.g. poly(stearyl methacrylate) beads) | about 0.2–2.5 wt % |
| bleaching agent (e.g. diphenylguanidine) | about 2–25 wt % |

In another embodiment of the present invention the receptor layer is obtained by coating the following formulation from methylethyl ketone (MEK) to provide a dry coating weight of 400 Mg/ft$^2$ (4.3 g/m$^2$):

| | |
|---|---|
| hydroxylic polymer (e.g., BUTVAR B76 available from Solutia, Inc. St. Louis, MO) | about 70 to 90 wt % |
| texturizing material (e.g. poly(stearyl methacrylate) beads) | about 0.2–2.5 wt % |
| bleaching agent (e.g. diphenylguanidine) | about 2–25 wt % |

Imaging Conditions

The procedure for imagewise transfer of material from donor to receptor involves assembling the two elements in intimate face-to-face contact, such as by vacuum hold down or alternatively by means of the cylindrical lens apparatus described in U.S. Pat. No. 5,475,418 (Patel et al.) and exposing the assembly to thermal energy.

In one embodiment of the present invention the thermal energy is provided by scanning the assembly with a suitable laser. The assembly may be imaged by any of the commonly used lasers, depending on the cationic IR absorbing dye used. In one embodiment of the present invention exposure to laser radiation by near IR and IR emitting lasers such as diode lasers and YAG lasers, is employed.

Any of the known scanning devices may be used, such as flat-bed scanners, external drum scanners, or internal drum scanners. In these devices, the assembly to be imaged is secured to the drum or bed such as by vacuum hold-down, and the laser beam is focused to a spot of about 20 micrometers diameter for instance, on the donor-receptor assembly. This spot is scanned over the entire area to be imaged while the laser output is modulated in accordance with electronically stored image information. Two or more lasers may scan different areas of the donor receptor assembly simultaneously, and if necessary, the output of two or more lasers may be combined optically into a single spot of higher intensity. Exposure to laser radiation is normally from the donor side, but may be from the receptor side if the receptor is transparent to the laser radiation.

Peeling apart the donor and receptor reveals a monochrome image on the receptor. The process may be repeated one or more times using donor sheets of different colors to build a multicolor image on a common receptor. Because of the interaction of the cationic IR absorbing dye and the bleaching agent during exposure to laser radiation, the final image can be free from contamination by the cationic IR absorbing dye. Typically, in the embodiments in which a bleaching agent is present in the receiving layer, subsequent heat treatment of the image may be required to activate or accelerate the bleach chemistry.

After peeling the donor sheet from the receptor, the image residing on the receptor can be cured by subjecting it to heat treatment where the temperatures are in excess of about 120° C. This may be carried out by a variety of means, such as by storage in an oven, hot air treatment, contact with a heated plate or passage through a heated roller device. In the case of multicolor imaging, where two or more monochrome images are transferred to a common receptor, it is more convenient to delay the curing step until all the separate colorant transfer steps have been completed, then provide a single heat treatment for the composite image. However, if the individual transferred images are particularly soft or easily damaged in their uncured state, then it may be necessary to cure and harden each monochrome image prior to transfer of the next.

In certain embodiments, the bleaching agent is present initially in neither the donor nor the receptor and an additional step is required to bring it into contact with the contaminated image. While this technique requires an extra step, it does allow the use of an uncoated receptor, such as plain paper. Any suitable means may be employed to apply the bleaching agent to the transferred image, but "wet" methods such as dipping or spraying, possess disadvantages compared to dry methods. A suitable dry method is thermal lamination and subsequent peeling of a separate donor sheet containing the thermal bleaching agent. A bleaching agent donor sheet suitable for this purpose typically comprises a substrate bearing a layer of a hydroxylic polymer-containing the bleaching agent in an amount corresponding to from about 5 to 25 wt % of the total solids. Alternatively, the bleaching agent is present in an amount of from about 10 to 20 wt %. Thus the construction of a bleaching agent donor sheet in accordance with the invention is very similar to that of a receptor element in accordance with the invention, and indeed a single element might well be capable of fulfilling either purpose.

In some situations, the receptor to which a colorant image is initially transferred is not the final substrate on which the image is viewed. For example, U.S. Pat. No. 5,126,760 (DeBoer) discloses thermal transfer of a multicolor image to a first receptor, with subsequent transfer of the composite image to a second receptor for viewing purposes. If this technique is employed in the practice of the present invention, curing and hardening of the image may conveniently be accomplished in the course of the transfer to the second receptor. In this embodiment of the invention, the second receptor may be a flexible sheet-form material such as paper, card, or plastic film, for example. Alternatively, it may be convenient to provide the thermal bleaching agent in the second receptor, and/or to utilize the heat applied in the process of transferring the image to the second receptor to activate the bleaching reaction.

In one embodiment of the present invention the imaging unit is the CREOSCITEX TRENDSETTER imager available commercially as the CREO TRENDSETTER SPECTRUM. The imaging conditions used are machine set points selected to best expose the media defined in the invention. Drum speed (DS) is revolutions per minute (RPM) the media is rotated in at the front of the laser thermal head. The Wpower is the total watts of imaging power from that head. SR stands for surface reflectivity and is measured by the laser thermal head focusing mechanism. This value is media dependent and is used to obtain best focusing performance. SD stands for surface depth and is set to obtain the best performance of the focusing mechanism. It is also media dependent. The methods to do these measurements are described in published Creo instruction manuals and technical literature. The machine stores these values and automatically selects them based on what color donor is to be imaged.

Further objects and advantages of the invention will become apparent from a consideration of the examples and ensuing description which illustrate embodiments of the invention, it being understood that the foregoing statements of the objects of the invention are intended to generally explain the same without limiting it in any manner.

EXAMPLES

The following materials are used in the Examples:

Binder Material:
BUTVAR B-72 (polyvinylbutryal resin with free OH content of from about 17.5 to 20 mole %) available from Solutia Inc., St. Louis, Mo.
BUTVAR B-76 (polyvinylbutryal resin with free OH content of from about 11 to 13 mole %) available from Solutia, Inc
Infra-red Absorbing Dye:—PC 364 having the following structure:

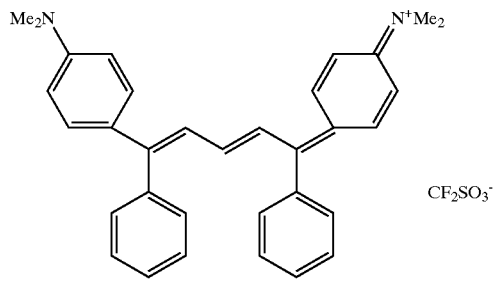

Additional—HPA 1186 having the following structure:
Crosslinking Agent:

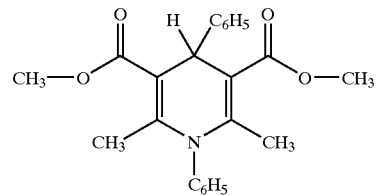

available from St. Jean Photochemicals
Fluorocarbon:—FX 12 (N-methylperfluorooctanesulphonamide) available from 3M, St. Paul, Minn.
Dispersible Material:
RS 209 MAG MB (RS Magenta (Red 209)) available from Clariant, Sulzbach an Tun, Germany
BS 184 MAG MB
C Blk Millbase
Optional Additives:—FC 55/35/10 (surfactant) available from 3M
Thermally Activated
Crosslinking Agent:
CK-2500
Durite SD-7280
Solvent:—MEK (methyl ethyl ketone) available from Aldrich Chemical Company
Substrate:
PET (polyethyleneterephthalate film) available from Dupont, Wilmington, Del.
IC 562 Film available from DuPont
Receptor:—MPDH commercial base available from Kodak Polychrome Graphics
Laminator:—447L laminator available from Kodak Polychrome Graphics
Imager:—CREOSCITEX TRENDSETTER imager available as the CREO TRENDSETTER SPECTRUM
Absorption
Measurement Device—Shimadzu UV3101 PC UV-VIS-NIR Scanning Spectrophotometer available from Shimadzu North America, Columbia Md.

Samples were prepared using the formulations provided in Table I.

TABLE I

| Material | (A) Standard Magenta Control (wt-% of total) | (B) Standard Magenta w/ CK-2500 (wt-% of total) | (C) Standard Magenta w/Durite SD-7280 (wt-% of total) | (D) High Density Magenta Control (wt-% of total) | (E) High Density Magenta w. CK-2500 (wt-% of total) | (F) High Density Magenta W/Durite SD-7280 (wt-% of total) |
|---|---|---|---|---|---|---|
| RS 209 MAG MB | 23.24 | 23.24 | 23.24 | 12.41 | 12.41 | 12.41 |
| BS 184 MAG MB | 9.81 | 9.81 | 9.81 | 18.28 | 18.28 | 18.28 |
| Butvar B76 | 8.45 | 8.45 | 8.45 | 9.72 | 12.04 | 12.04 |
| PC 364 | 0.76 | 0.76 | 0.76 | 0.74 | 0.74 | 0.74 |
| FC 55/35/10 | .48 | 0.48 | 0.48 | 0.43 | 0.48 | 0.48 |
| FX 12 | .53 | 0.53 | 0.53 | 0.52 | 0.52 | 0.52 |
| HPA 1186 | 0.44 | | | 0.48 | | |
| CK-2500 | | 2.20 | | | 1.12 | |
| Durite SD-7280 | | | 2.20 | | | 1.12 |
| MEK | 56.29 | 54.53 | 54.53 | 57.42 | 54.42 | 54.42 |

Imaging Performance Study

The formulations were coated at an appropriate wet coating weight onto a PET substrate and dried for about 2 minutes at 95° C. to form a donor element for each formulation. Each of samples (A) through (F) were assembled to be in contact with a commercial b ase receptor and then imaged using a CREOSCITEX TRENDSETTER imager. The imaging conditions for each sample a re available in Table II.

TABLE II

| Sample | $W_{Power}$ (watts) | $D_s$ (RPM) | SD | SR |
|---|---|---|---|---|
| (A)–(C) Standard Magenta | 15.5 | 120 | 75 | 0.46 |
| (D)–(F) High Density (HD) Magenta | 15.2 | 135 | 80 | 0.46 |

The imaged samples were then laminated using a 447L laminator to commercial base. The reflection optical density (ROD) and dot gain of each imaged and laminated sample was then measured. The ROD is a measurement of the density of a solid patch of color. A generally acceptable ROD for a high density magenta donor is from about 1.40 to about 1.55 while a generally acceptable ROD for a standard magenta donor is from about 1.30 to about 1.45. The dot gain of the imaged donor is a measurement of the density of the tint of a solid patch of color relative to the density of a solid patch of color. Generally, a dot gives only a certain density but because of factors related to the geometry of the dot. In printing applications, however, the density is generally greater than what would be expected. A generally acceptable dot gain is from about 20 to about 30%.

As is evident by table II, substantially identical results were obtained for the ROD and dot gain of each sample. This indicates that there is no loss of crosslinking capability for the phenolic containing crosslinking agents CK-2500 and Durite SD-7280 as compared to the conventional HPA 1186 crosslinking agent.

TABLE III

| | Reflection Optical Density (ROD) | Dot Gain |
|---|---|---|
| Sample (A) Standard Magenta Control | 1.33 | 26 |
| Sample (B) Standard Magenta w/CK-2500 | 1.34 | 26 |
| Sample (C) Standard Magenta w/Durite SD-7280 | 1.35 | 26 |
| Sample (D) High Density Magenta Control | 1.45 | 27 |
| Sample (E) High Density Magenta w/CK-2500 | 1.45 | 26 |
| Sample (F) High Density Magenta w/Durite SD-7280 | 1.47 | 26 |

Accelerated Aging Studies

The absorption characteristics of each sample were measured using both aged and non-aged samples of the donors. Results of the testing with the non-aged and aged donor elements are provided in Tables IV a–c. In these tables, P stands for pigment absorbance and D stands for dye (cationic infrared absorption dye) absorbance. An increase of the ratio P/D generally indicates that the donor element (and particularly the cationic infrared absorbing dye) is exhibiting signs of aging and unable to absorb as effectively. Additionally, when the ratio of P/D changes by from about 20 to about 25%, the ROD and dot gain of the donor element exhibits significant decrease, which results in overall lack of dot quality.

The absorption characteristics of the non-aged samples are available in Table IV a.

To accelerate the aging process of the samples, each sample was held for 3 days at 60° C. The absorbance characteristics of the aged samples were then measured using a Shimadzu UV3101 PC UV-VIS-NIR Scanning Spectrophotometer. These results are available in Table IV b.

Table IV c. presents the percent change in absorption between the aged and non-aged samples.

TABLE IV-a

| Absorption of Non-Aged Donors | P (537 nm) | P (670 nm) | D (837 nm) | P/D (P = 537 nm; D = 837 nm) |
|---|---|---|---|---|
| Sample (A) Standard Magenta Control | 1.32 | 0.63 | 1.03 | 1.28 |
| Sample (B) Standard Magenta w/CK-2500 | 1.38 | 0.60 | 1.00 | 1.38 |
| Sample (C) Standard Magenta w/Durite SD-7280 | 1.45 | 0.64 | 1.18 | 1.23 |
| Sample (D) High Density Magenta Control | 1.7 | 0.59 | 0.97 | 1.76 |
| Sample (E) High Density Magenta w/CK-2500 | 1.92 | 0.64 | 1.08 | 1.78 |
| Sample (F) High Density Magenta w/ Durite SD-7280 | 1.90 | 0.64 | 1.18 | 1.61 |

TABLE IV-b

| Absorption of Aged Donors (3 days at 60° C.) | P (537 nm) | P (670 nm) | D (837 nm) | P/D (P = 537 nm; D = 837 nm) |
|---|---|---|---|---|
| Sample (A) Standard Magenta Control | 1.29 | 0.47 | 0.84 | 1.53 |
| Sample (B) Standard Magenta w/CK-2500 | 1.33 | 0.58 | 0.89 | 1.50 |
| Sample (C) Standard Magenta w/Durite SD-7280 | 1.47 | 0.63 | 1.07 | 1.37 |
| Sample (D) High Density Magenta Control | 1.64 | 0.39 | 0.76 | 2.15 |
| Sample (E) High Density Magenta w/CK-2500 | 1.89 | 0.62 | 0.96 | 1.96 |
| Sample (F) High Density Magenta w/Durite SD-7280 | 1.90 | 0.61 | 1.08 | 1.76 |

TABLE IV-c

| % Change in Adsorption after 3 days at 60° C. | P (537 nm) | P (670 nm) | D (837 nm) | P/D (P = 537 nm; D = 837 nm) |
|---|---|---|---|---|
| Sample (A) Standard Magenta | -2.24 | -25.57 | -18.7 | 20.2 |

TABLE IV-c-continued

| % Change in Adsorption after 3 days at 60° C. | P (537 nm) | P (670 nm) | D (837 nm) | P/D (P = 537 nm; D = 837 nm) |
|---|---|---|---|---|
| Control Sample(B) Standard Magenta w/CK-2500 | −3.60 | −1.93 | −11.5 | 8.9 |
| Sample (C) Standard Magenta w/Durite SD-7280 | 1.12 | −1.52 | −8.7 | 10.9 |
| Sample (D) High Density Magenta Control | −3.52 | −34.69 | −21.0 | 22.1 |
| Sample (E) High Density Magenta w/CK-2500 | −1.50 | −1.87 | −10.8 | 10.4 |
| Sample (F) High Density Magenta w/Durite SD-7280 | 0.13 | −4.19 | −8.6 | 9.5 |

Sensitivity data for Samples (A), (B), (D) and (E) is presented in Table V and the following graphs. The graphs illustrate sensitivity of the cationic infrared absorbing dye for Samples (A), (B), (D) and (E) as evaluated by measuring the ROD (density) as a function of laser power (Wpower). Three sheets of each sample were aged over a period of 3 days where each sample was kept in a 60° C. oven. A fourth sheet of each sample was not kept in a 60° C. oven.

Samples (B) and (E), which included the thermally activated crosslinking agent of the present invention, exhibited more consistent sensitivity with aging over a range of different imaging power. This is represented by the plateau regions where the measured density showed greater consistency over a greater range of Wpower. This is in contrast to Samples (A) and (D), which did not include the thermally activated crosslinking agent of the present invention. As is evident in the graphs, Samples (A) and (D) exhibited greater variability over the same range of laser power conditions, which demonstrates the reduced absorbance of the cationic infrared absorbing dye. Table VI presents calculated values of Wpower required to achieve sensitivity in the regions of the graphs represented by plateaus.

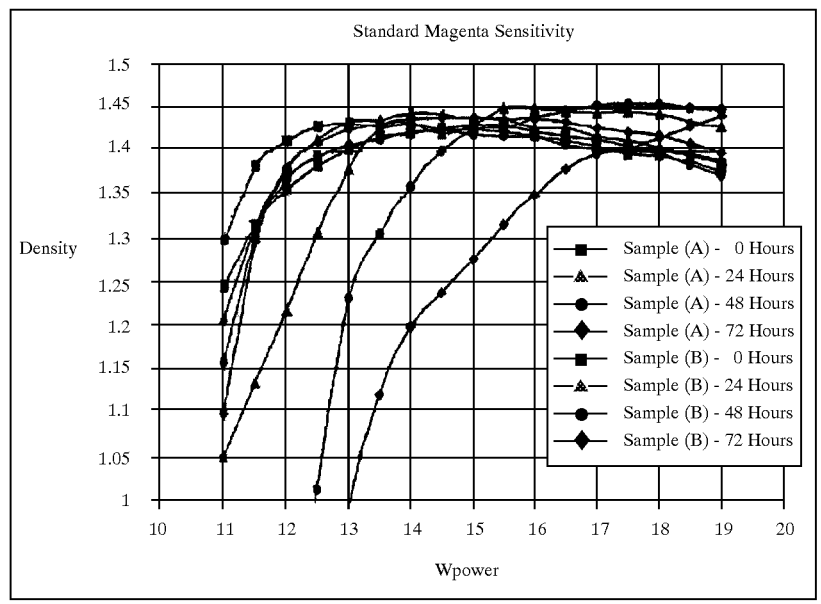

-continued

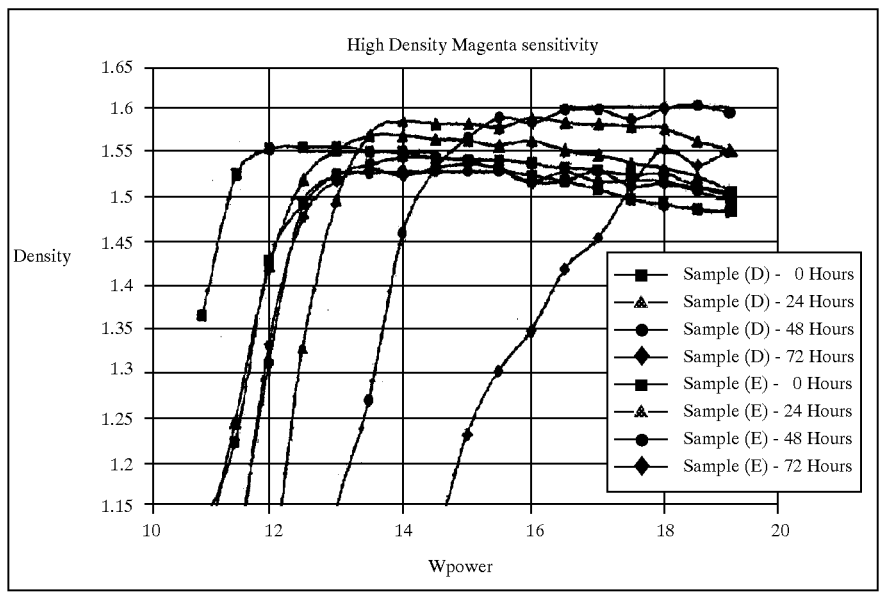

TABLE VI

Calculated Wpower sensitivity

| | 0 HOURS | 24 HOURS | 48 HOURS | 72 HOURS |
|---|---|---|---|---|
| Sample (A) Standard Magenta Control | 13.83 | 15.94 | 18.13 | 21.50 |
| Sample (B) Standard Magenta w/CK-2500 | 15.09 | 14.53 | 14.34 | 14.55 |
| Sample (D) High Density Magenta Control | 13.44 | 15.55 | 17.55 | 20.5 |
| Sample (E) High Density Magenta w/CK-2500 | 14.99 | 14.83 | 14.80 | 14.97 |

What is claimed is:

1. A donor element comprising
a donor substrate coated with a transfer layer having
a donor binder;
a cationic infrared absorbing dye;
a thermally activated crosslinking agent of the formula

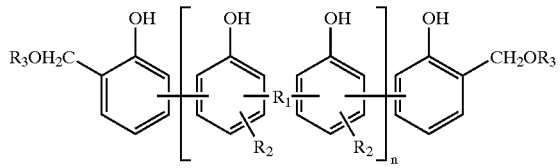

wherein n is 1–50, $R_1$ is $CH_2$ or $CH_2OCH_2$ at either an ortho- or para-position, $R_2$ is alkyl at the meta-position when $R_1$ is para or alkyl at the para-position when $R_1$ is ortho- and $R_3$ is independently hydrogen or butyl; and
a dispersible material.

2. The donor element of claim 1 wherein the transfer layer further comprises a fluorocarbon additive.

3. The donor element of claim 2 wherein the fluorocarbon additive comprises a sulfonamido compound.

4. The donor element of claim 2 wherein the fluorocarbon additive comprises $(C_8F_{17})SO_2NH(CH_2CH_3)$.

5. The donor element of claim 2 wherein the fluorocarbon additive is present in an amount of from about 0.5 to about 5 wt-% based on the total weight of the transfer layer.

6. The donor element of claim 1 wherein the transfer layer further comprising coating aids, dispersing agents, optical brighteners, UV absorbers, fillers, surfactants, plasticizers or combinations thereof.

7. The donor element of claim 1 wherein the donor binder comprises a hydroxylic polymer.

8. The donor element of claim 1 wherein the donor binder is polyvinyl butyral.

9. The donor element of claim 1 wherein the donor binder is present in an amount of from about 20 to about 50 wt-% based upon the weight of the transfer material.

10. The donor element of claim 1 wherein the cationic infrared absorbing dye is a bleachable dye.

11. The donor element of claim 1 wherein the cationic infrared absorbing dye is a tetraarylpolymethine dye, an amine cation radical dye, or mixtures thereof.

12. The donor element of claim 1 wherein the cationic infrared absorbing dye is a tetraarylpolymethine dye.

13. The donor element of claim 1 wherein the cationic infrared absorbing dye is present in an amount of from about 5 to about 20 wt-% based on total weight of the transfer layer.

14. The donor element of claim 1 wherein the thermally activated crosslinking agent is of the formula

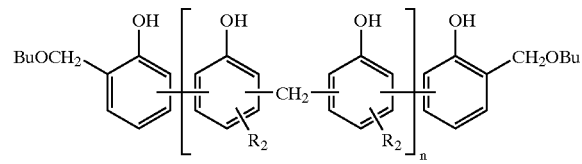

wherein n is 1–50 and $R_2$ can be independently hydrogen or alkyl.

15. The donor element of claim 1 wherein the thermally activated crosslinking agent is of the formula

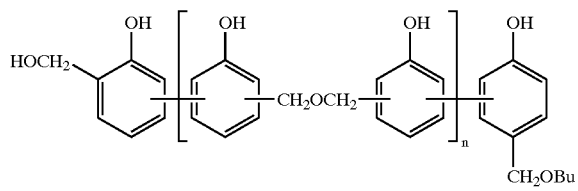

wherein n is 1–50 and $R_2$ can be independently hydrogen or alkyl.

16. The donor element of claim 1 wherein the thermally activated crosslinking agent is present in an amount of from about 1 to about 10 wt-% based on the total weight of the transfer layer.

17. The donor element of claim 1 wherein the dispersible material is a pigment, a crystalline nonsubliminable dye, a color enhancing additive, a texturizing material, or mixtures thereof.

18. The donor element of claim 1 wherein the dispersible material comprises a pigment.

19. The donor element of claim 1 wherein the dispersible material comprises a cystalline nonsubliminable dye.

20. The donor element of claim 1 wherein the dispersible material comprises metallic flakes.

21. The donor element of claim 1 wherein the dispersible material is present in an amount of from about 15 to about 50 wt-% based on the total weight of the transfer layer.

22. The donor element of claim 1 wherein the transfer material further comprises a crosslinking agent of the formula

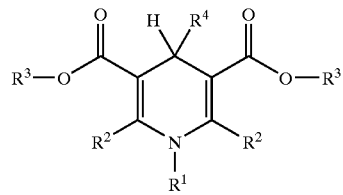

wherein $R^1$ is hydrogen, alkyl, cycloalkyl or aryl, $R^2$ and $R^3$ are independently alkyl or aryl and $R^4$ is aryl.

23. The donor element of claim 1 wherein the donor element material further comprises an intermediate transfer layer disposed between the substrate and the transfer layer having
    an intermediate layer donor binder; and
    a cationic infrared absorbing dye.

24. A thermal imaging system comprising
    a donor element comprising a donor substrate coated with
      a transfer layer having
        a donor binder;
        a cationic infrared absorbing dye;
        a thermally activated crosslinking agent of the formula

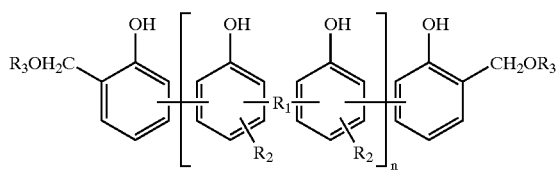

wherein n is 1–50, $R_1$ is $CH_2$ or $CH_2OCH_2$ at either an ortho- or para-position, $R_2$ is alkyl at the meta-position when $R_1$ is para or alkyl at the para-position when $R_1$ is ortho- and $R_3$ is independently hydrogen or butyl; and
    a dispersible material; and
    a receptor element.

25. The thermal imaging system of claim 24 wherein the transfer material further comprises a fluorocarbon additive.

26. The thermal imaging system of claim 25 wherein the fluorocarbon additive comprises a sulfonamido compound.

27. The thermal imaging system of claim 25 wherein the fluorocarbon additive comprises $(C_8F_{17})SO_2NH(CH_2CH_3)$.

28. The thermal imaging system of claim 25 wherein the fluorocarbon additive is present in an amount of from about 0.5 to about 5 wt-% based on the total weight of the transfer layer.

29. The thermal imaging system of claim 24 wherein the transfer layer further comprises coating aids, dispersing agents, optical brighteners, UV absorbers, fillers, surfactants, plasticizers or combinations thereof.

30. The thermal imaging system of claim 24 wherein the donor binder comprises a hydroxylic polymer.

31. The thermal imaging system of claim 24 wherein the donor binder is polyvinyl butyral.

32. The thermal imaging system of claim 24 wherein the donor binder is present in an amount of from about 20 to about 50 wt-% based upon the weight of the transfer layer.

33. The thermal imaging system of claim 24 wherein the cationic infrared absorbing dye is a bleachable dye.

34. The thermal imaging system of claim 24 wherein the cationic infrared absorbing dye is a tetraarylpolymethine dye, an amine cation radical dye, or mixtures thereof.

35. The thermal imaging system of claim 24 wherein the cationic infrared absorbing dye is a tetraarylpolymethine dye.

36. The thermal imaging system of claim 24 wherein the cationic infrared absorbing dye is present in an amount of from about 5 to about 20 wt-% based on total weight of the transfer layer.

37. The thermal imaging system of claim 24 wherein the thermally activated crosslinking agent is of the formula

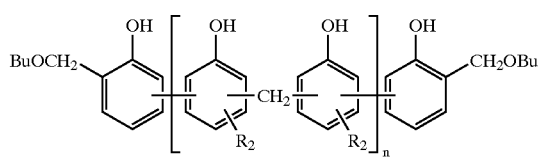

wherein n is 1–50 and $R_2$ can be independently hydrogen or alkyl.

38. The thermal imaging system of claim 24 wherein the thermally activated crosslinking agent of the formula

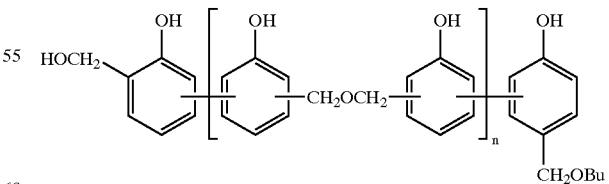

wherein n is 1–50 and $R_2$ can be independently hydrogen or alkyl.

39. The thermal imaging system of claim 24 wherein the thermally activated crosslinking agent is present in an amount of from about 1 to about 10 wt-% based on the total weight of the transfer material.

40. The thermal imaging system of claim 24 wherein the dispersible material is a pigment, a crystalline nonsubliminable dye, a color enhancing additive, a texturizing material, or mixtures thereof.

41. The thermal imaging system of claim 24 wherein the dispersible material comprises a pigment.

42. The thermal imaging system of claim 24 wherein the dispersible material comprises a cystalline nonsubliminable dye.

43. The thermal imaging system of claim 24 wherein the dispersible material comprises metallic flakes.

44. The thermal imaging system of claim 24 wherein the dispersible material is present in an amount of from about 15 to about 50 wt-% based on the total weight of the transfer layer.

45. The thermal imaging system of claim 24 wherein the transfer material further comprises a crosslinking agent of the formula

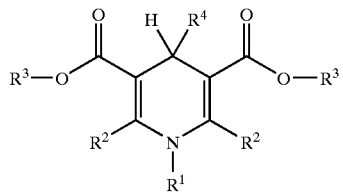

wherein $R^1$ is hydrogen, alkyl, cycloalkyl or aryl, $R^2$ and $R^3$ are independently alkyl or aryl and $R^4$ is aryl.

46. The thermal imaging system of claim 24 wherein the donor element further comprises an intermediate transfer layer disposed between the substrate and the transfer layer having
an intermediate layer donor binder; and
a cationic infrared absorbing dye.

47. The thermal imaging system of claim 24 wherein the receptor element comprises a receptor binder.

48. The thermal imaging system of claim 24 wherein the receptor element comprises a bleaching agent.

49. The thermal imaging system of claim 24 wherein the receptor element comprises a substrate having a textured receiving layer surface comprising a plurality of protrusions projecting above the outer surface of the substrate by an average distance of from about 1 μm to about 8 μm.

50. A laser-induced thermal imaging system comprising:
a donor element comprising a donor substrate coated with
a transfer layer having:
a donor binder;
a fluorocarbon additive;
a cationic infrared absorbing dye;
a thermally activated crosslinking agent of the formula:

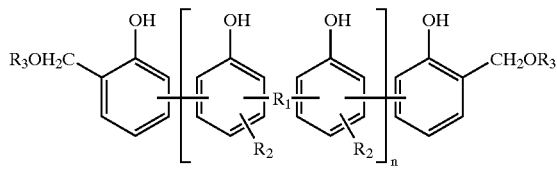

wherein n is 0 to 50, $R_1$ is $CH_2$ or $CH_2OCH_2$ at either an ortho- or para-position, $R_2$ is alkyl at the meta-position when $R_1$ is para or alkyl at the para-position when $R_1$ is ortho and $R_3$ is independently hydrogen or butyl; and
a dispersible material; and a receptor element comprising a receptor substrate coated with a receptor material having:
a receptor binder;
a bleaching agent; and
particulate material.

51. A method of imaging comprising the steps of:
(a) assembling a donor element in contact with a receptor element wherein the donor element comprises a donor substrate coated with a transfer layer having:
a donor binder;
a cationic infrared absorbing dye;
a thermally activated crosslinking agent of the formula:

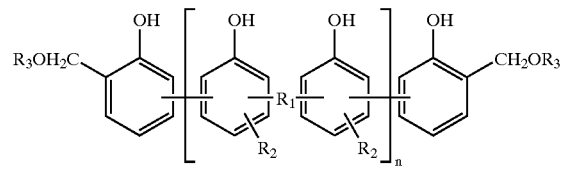

wherein n is 0 to 50, $R_1$ is $CH_2$ or $CH_2OCH_2$ at either an ortho- or para-position, $R_2$ is alkyl at the meta-position when $R_1$ is para or alkyl at the para-position when $R_1$ is ortho and $R_3$ is independently hydrogen or butyl; and
a dispersible material (b) exposing the assembly to laser radiation of a wavelength absorbed by the cationic infrared absorbing dye wherein the laser radiation is capable of being modulated in accordance with digitally stored image information, wherein the exposed portions of the donor element are transferred to the receptor element; and (c) separating the donor element and the receptor element, wherein the image residing on the receptor element is revealed.

52. The method of imaging of claim 51 wherein the method further comprises the step of subjecting the receptor element and image residing on the receptor element to heat treatment.

53. The method of imaging of claim 51 wherein steps (a)–(c) form a cycle which is repeated, wherein a different donor element comprising a different dispersant is used for each cycle, but the same receptor element is used for each cycle.

54. The method of imaging of claim 51 wherein the image residing on the receptor after all the repetitions of steps (a)–(c) is transferred to another receptor as a final step.

55. A method of making a thermal imaging system comprising the steps of:
(a) dissolving a donor binder, a cationic infrared absorbing dye, a thermally activated crosslinking agent of the formula:

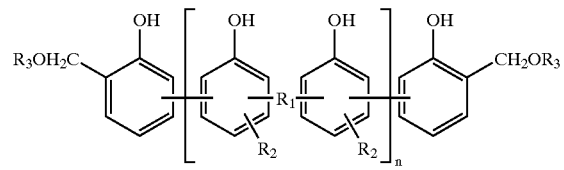

wherein n is 0 to 50, $R_1$ is $CH_2$ or $CH_2OCH_2$ at either an ortho- or para-position, $R_2$ is alkyl at the meta-position when $R_1$ is para or alkyl at the para-position when $R_1$ is ortho and $R_3$ is independently hydrogen or butyl, and a dispersible material with an organic solvent to form a donor solution;

(b) coating the donor solution onto a donor substrate;
(c) drying the donor solution coating;
(d) dissolving a receptor binder and a bleaching agent with an organic solution;
(e) coating the receptor solution onto a receptor substrate; and
(f) drying the receptor solution coating.

56. The method of making a thermal imaging system of claim 55 wherein the donor solution further comprises a fluorocarbon additive.

57. The method of making a thermal imaging system of claim 55 wherein the donor solution further comprises optional additives.

58. The method of making a thermal imaging system of claim 55 wherein the donor solution further comprises an organic solvent.

59. The method of making a thermal imaging system of claim 58 wherein the organic solvent is methyl ethyl ketone, methyl isobutyl ketone, ethanol or mixtures thereof.

* * * * *